United States Patent
Mitsumoto

(10) Patent No.: US 7,397,880 B2
(45) Date of Patent: Jul. 8, 2008

(54) SYNCHRONIZATION CIRCUIT AND SYNCHRONIZATION METHOD

(75) Inventor: Kinya Mitsumoto, Tamamura (JP)

(73) Assignee: Renesas Technology Corp., Tokyo (JP)

( * ) Notice: Subject to any disclaimer, the term of this patent is extended or adjusted under 35 U.S.C. 154(b) by 588 days.

(21) Appl. No.: 11/156,473

(22) Filed: Jun. 21, 2005

(65) Prior Publication Data

US 2005/0232386 A1   Oct. 20, 2005

Related U.S. Application Data

(63) Continuation of application No. 10/766,945, filed on Jan. 30, 2004, now Pat. No. 6,909,312.

(30) Foreign Application Priority Data

Jan. 31, 2003 (JP) .............................. 2003-023017

(51) Int. Cl.
    *H04L 25/40* (2006.01)
(52) U.S. Cl. .................. 375/371; 375/376; 327/144; 327/149; 327/156; 327/158
(58) Field of Classification Search ......... 375/373–376; 327/144, 146–150, 153, 155–158
    See application file for complete search history.

(56) References Cited

U.S. PATENT DOCUMENTS

| | | | |
|---|---|---|---|
| 5,883,534 A | 3/1999 | Kondoh et al. | |
| 5,969,552 A | 10/1999 | Lee et al. | |
| 6,052,004 A | 4/2000 | Saeki | |
| 6,066,968 A | 5/2000 | Yang | |
| 6,172,537 B1 | 1/2001 | Kanou et al. | |
| 6,259,288 B1 * | 7/2001 | Nishimura | 327/156 |
| 6,388,945 B2 | 5/2002 | Aikawa | |
| 6,392,456 B1 * | 5/2002 | Pyeon et al. | 327/156 |
| 6,509,763 B2 | 1/2003 | Taguchi et al. | |
| 6,593,786 B2 | 7/2003 | Jung | |
| 6,677,792 B2 | 1/2004 | Kwak | |
| 6,774,689 B1 | 8/2004 | Sudjian | |

FOREIGN PATENT DOCUMENTS

| | | |
|---|---|---|
| JP | 08-307254 | 11/1996 |
| JP | 11-004145 | 1/1999 |

* cited by examiner

*Primary Examiner*—Dac V Ha
(74) *Attorney, Agent, or Firm*—Antonelli, Terry, Stout & Kraus, LLP.

(57) ABSTRACT

In a synchronization circuit and a synchronization method, a first variable delay circuit generates a first pulse to be synchronized with a reference pulse, a second pulse which is leading in the phase to the first pulse, and a third pulse which is delayed in the phase from the first pulse. The reference pulse and the first pulse are compared by a first phase comparing circuit, and the reference pulse, second pulse and third pulse are compared by a second phase comparing circuit. A control voltage generating circuit forms a control voltage by giving priority to a comparison output of the second phase comparing circuit against a comparison output of the first phase comparing circuit. Delay time of the first variable delay circuit is controlled after the phases are matched by forming the control voltage with the comparison output of the first phase comparing circuit.

15 Claims, 15 Drawing Sheets

UP COARSE ADJUSTMENT

DOWN COARSE ADJUSTMENT

UP FINE ADJUSTMENT

DOWN FINE ADJUSTMENT

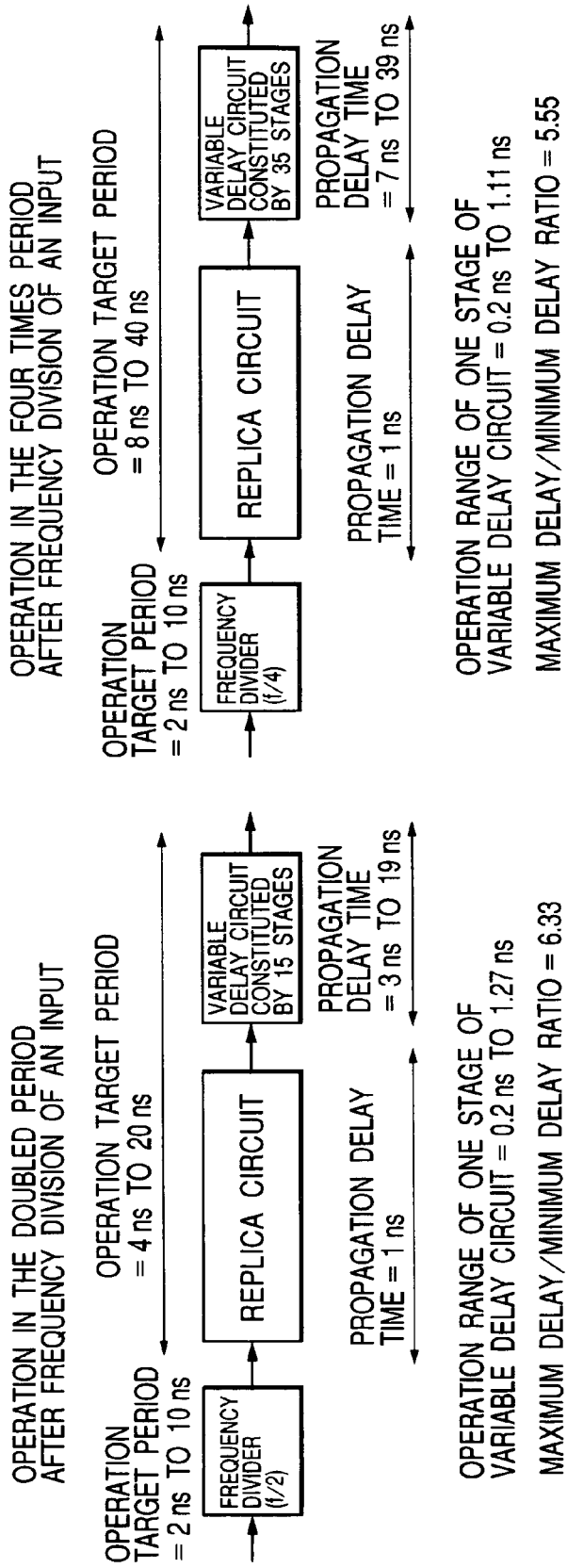

EXAMPLE OF STRUCTURE OF VARIABLE DELAY CIRCUIT 2
(IN THE CASE OF 1/4 FREQUENCY DIVISION)

ns a US 7,397,880 B2

SYNCHRONIZATION CIRCUIT AND SYNCHRONIZATION METHOD

CROSS-REFERENCE TO RELATED APPLICATIONS

This is a continuation of application Ser. No. 10/766,945 filed 30 Jan. 2004, now U.S. Pat. No. 6,909,312, the contents of which are incorporated herein in their entirety.

BACKGROUND OF THE INVENTION

The present invention relates to a synchronization circuit and a synchronization method; and more particularly, the invention relates, for example, to a technique which can be effectively utilized for effecting phase synchronization in a DLL (or PLL) circuit of the type provided in a semiconductor integrated circuit device.

An example of a PLL circuit which can continuously change over between coarse adjustment and fine adjustment is disclosed in Japanese Published Unexamined Patent Application No. Hei 08(1996)-307254. Moreover, an example of a frequency multiplying circuit, including a combining circuit, is disclosed in Japanese Published Unexamined Patent Application No. 11(1999)-004145.

[Patent Document 1]
Japanese Published Unexamined Patent Application No. Hei 08(1996)-307254
[Patent Document 2]
Japanese Published Unexamined Patent Application No. Hei 11(1999)-004145

SUMMARY OF THE INVENTION

The technology described in the patent document 1 has a problem in that the tracking ability, when the phase deviates to a large extent, is bad because coarse adjustment and fine adjustment are performed based on the integration of A phase comparison pulse.

The technology described in the patent document 2 operates to multiply an input waveform, and the multiplied signal is inputted to a PLL circuit.

In an semiconductor integrated circuit device, the operating frequency is tending to become still higher. Therefore, even in the case of a synchronization circuit using a DLL circuit and a PLL circuit mounted into the semiconductor integrated circuit device, it is desirable to obtain a stable synchronization signal which assures higher response characteristic and includes a small amount of jitter. However, as is represented by the patent document 1, the response characteristic (tracking ability) and the stability are in the opposite relationship. Moreover, a problem also arises in that, when the frequency becomes higher, the signal waveform to be transferred is deformed and correct phase comparison becomes impossible.

An object of the present invention is to provide a synchronization circuit and a synchronization method in which both the response characteristic and the stability are satisfied with a simplified structure.

Another object of the present invention is to provide a synchronization circuit and a synchronization method to obtain a synchronization signal which is stabilized for frequencies up to a higher frequency.

The aforementioned and the other objects and novel features of the present invention will become more apparent from the description provided in the present specification and from the accompanying drawings.

A typical aspect of the present invention will be briefly described below. In addition to a first pulse to be synchronized with a reference pulse, a second pulse, which is leading in phase for a constant period relative to the first pulse, and a third pulse, which is delayed in phase for the constant period relative to the first pulse, are formed by a first variable delay circuit; the first pulse is compared with the reference pulse by a first phase comparison circuit; the second pulse and third pulse are compared with the reference pulse by a second phase comparison circuit; a control voltage is formed by giving priority to a comparison output of the second phase comparison circuit over a comparison output of the first phase comparison circuit by a control voltage generating circuit, which receives the comparison output of the first phase comparison circuit and the comparison output of the second phase comparison circuit; and, after the phase of the reference pulse is matched with the phase of the second pulse or third pulse by the second phase comparison circuit, a control voltage is formed by the comparison output of the first phase comparison circuit in order to control the delay time of the first variable delay circuit.

Another typical aspect of the present invention will be briefly described below. A reference pulse signal is divided in frequency using a frequency dividing circuit; a first pulse signal to be synchronized with the frequency-divided pulse signal is formed by a first variable delay circuit; the frequency-divided pulse signal is compared with the first pulse signal in a first phase comparison circuit; the reference pulse signal is divided in frequency with the same dividing ratio as the frequency dividing circuit; multi-phase clocks corresponding to the frequency dividing ratio are formed in a frequency dividing/distributing circuit; the multi-phase clocks are respectively delayed by a second variable delay circuit formed by the frequency dividing/distributing circuit and having an identical structure to that of the first variable delay circuit; control voltages of the first variable delay circuit and the second variable delay circuit are formed by a control voltage generating circuit, which receives a comparison output of the first phase comparison circuit; and a pulse signal corresponding to the reference pulse signal is generated by transferring a plurality of delay outputs due provided by the second variable delay circuit to a waveform shaping circuit.

BRIEF DESCRIPTION OF THE DRAWINGS

FIGS. 11(*a*) and 11(*b*) are diagrams illustrating examples of measures for effecting disappearance of a pulse in FIG. 10 in relation to the present invention;

DETAILED DESCRIPTION OF THE PREFERRED EMBODIMENTS

Figure 1:
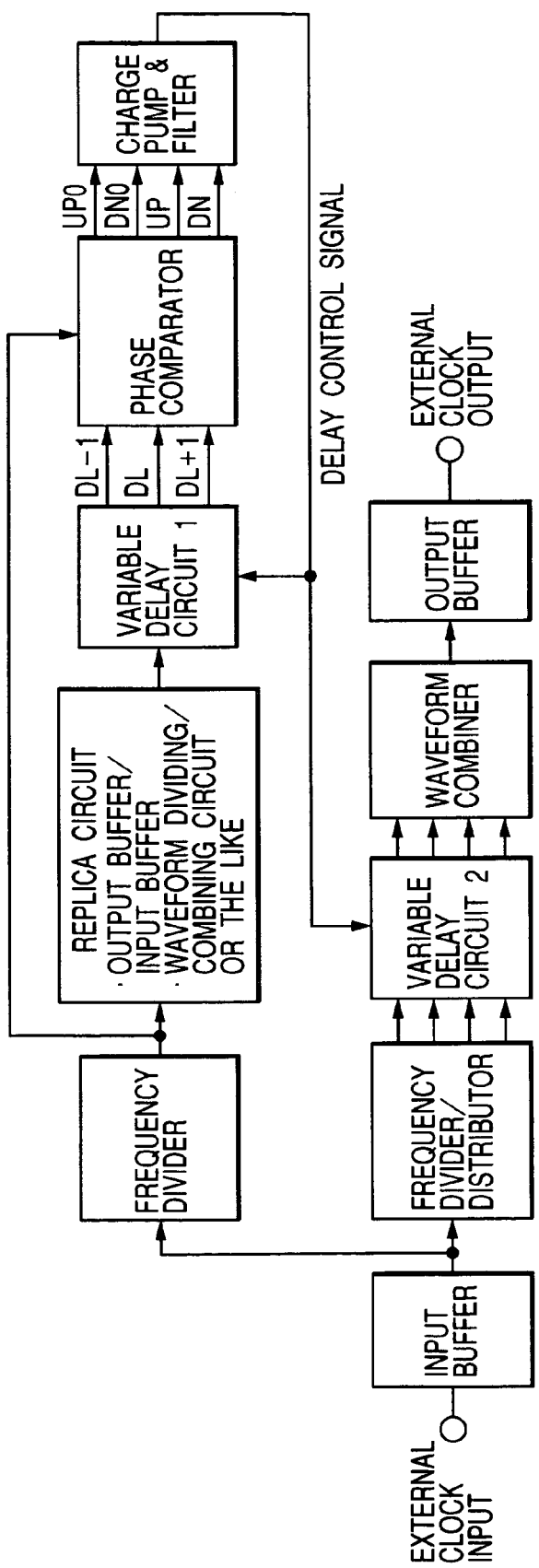
FIG. 1 is a block diagram illustrating an embodiment of a DLL circuit of the present invention.

FIG. 1 illustrates a block diagram of an embodiment of a DLL (Delay Locked Loop) circuit of the present invention. The DLL circuit of this embodiment forms an external clock output that is synchronized with an external clock input and is constituted by a DLL section and a delay section to delay the external clock input. In this embodiment, various concepts are combined to realize a highly accurate phase control operation and delay operation in a frequency range up to a still higher frequency band.

In this embodiment, phase control is performed by clearly selecting the coarse adjustment range and fine adjustment range in the DLL section. More particularly, a delay signal DL−1 in one preceding stage of the variable delay stage and a delay signal DL+1 in one subsequent stage thereof are formed for the standard delay signal DL in the variable delay circuit 1 of the DLL section. Namely, in the variable delay circuit 1, a unit variable delay stage is constituted by a plurality of stages, the standard delay signal DL, which is delayed by one or a plurality of periods for the input pulse, is formed, a delay signal in one preceding stage of the unit variable delay stage is formed as DL−1, while a delay signal in one subsequent stage is formed as DL+1.

In the DLL circuit of the present embodiment, which will be described later in more detail, the signal frequency is lowered by use of a frequency divider in order to realize a highly accurate phase control operation and a delay operation in a frequency range up to the higher frequency band, and this low frequency signal is inputted to the variable delay circuit 1 via a replica circuit. The standard delay signal DL, delay signals DL−1, DL+1 and the frequency-divided output from the frequency divider (input signal to the replica circuit) are compared in the phase comparator.

The phase comparator generates a phase comparison result UP/DN corresponding to the standard delay signal DL and a phase comparison result UP0/DN0 corresponding to the delay signals DL−1, DL+1. A charge pump & filter controls the delay time of the variable delay circuit 1 by receiving the phase comparison result and forming a delay control signal. Thereby, the phase of the output of the frequency divider is matched with the phase of the standard delay signal DL which is obtained by delaying this output. Namely, the phase of the input pulse inputted with a delay of one or a plurality of periods is matched with the phase of the standard delay signal DL.

The pulse (external clock), which is inputted through an input buffer, is frequency-divided using a frequency divider/distributor and is distributed to a plurality of signals corresponding to the frequency dividing ratio, and these distributed signals are delayed by a variable delay circuit 2 having a structure which is identical to that of the variable delay circuit 1. This variable delay circuit 2 is constituted by a unit variable delay stage to form the standard delay signal DL of the variable delay circuit 1. A plurality of delay signals, which are delayed by the variable delay circuit 2, are combined by a waveform combiner and converted to a pulse signal having a frequency which is identical to that of the original input pulse signal inputted through the input buffer, and the result is finally outputted as an external clock output through an output buffer.

A replica circuit of the DLL circuit is constituted by a circuit which is identical to a waveform dividing/combining circuit or the like, consisting of an output buffer, input buffer, frequency divider/distributor and waveform combiner, in order to monitor the delay of the signal in these circuit elements. Since the variable delay circuit 1 forms a delay control signal, with inclusion of such a signal delay, which is matched in phase with the input pulse, which is inputted with a delay of one or a plurality of periods from the standard delay signal DL, the variable delay circuit 2 is also configured to provide a delay identical to that of the variable delay circuit 1. As a result, the external clock output can be outputted as a pulse synchronized with the external clock input.

When the external clock is inputted and it is then outputted as an external clock after power amplification in a semiconductor integrated circuit device, a signal delay is generated in the input buffer section and output buffer section. Accordingly, when the external clock is outputted after power amplification, a delayed external clock is always formed. The signal delay in the input buffer and output buffer is compensated, and an external clock output synchronized with the external clock input can be formed by utilizing the DLL circuit of the present embodiment.

In the DLL circuit of this embodiment, the signals DL, DL−1, DL+1 are formed by the variable delay circuit 1, and phase control is performed by separating the coarse adjustment range and the fine adjustment range, in order to operate a coarse adjustment circuit when the phase difference between the input pulse and DL exceeds the delay in one stage of the unit variable delay stage in the phase comparator and to execute the fine adjustment when such phase difference is within the delay of one stage of the unit variable delay stage. Thereby, both a high-speed response characteristic and high stability can be attained, thereby to realize a phase control operation by setting the loop gain to the optimum value respectively corresponding to such coarse adjustment range and fine adjustment range.

The variable delay circuit 2 is usually configured to be identical to the variable delay circuit 1. In this case, there rises a problem in that the control voltage supplied to the variable delay circuits 1, 2 for processing a high frequency signal is unbalanced, and thereby the signal can no longer be transmitted. In regard to avoidance of waveform disappearance in the variable delay circuit 1, disappearance of a waveform is easily generated because the variable delay circuit 2 is required to delay the signal while the input signal period is maintained. In this embodiment, deformation or disappearance of a waveform can be prevented by generating a multi-phase signal for a lower operation period of the variable delay circuit 2, and then sending this multiphase signal to the variable delay circuit 2. Namely, the problem of such disappearance of a waveform can be solved by recovering the signal of the original period from a plurality of signals using the waveform combiner.

Figure 2:
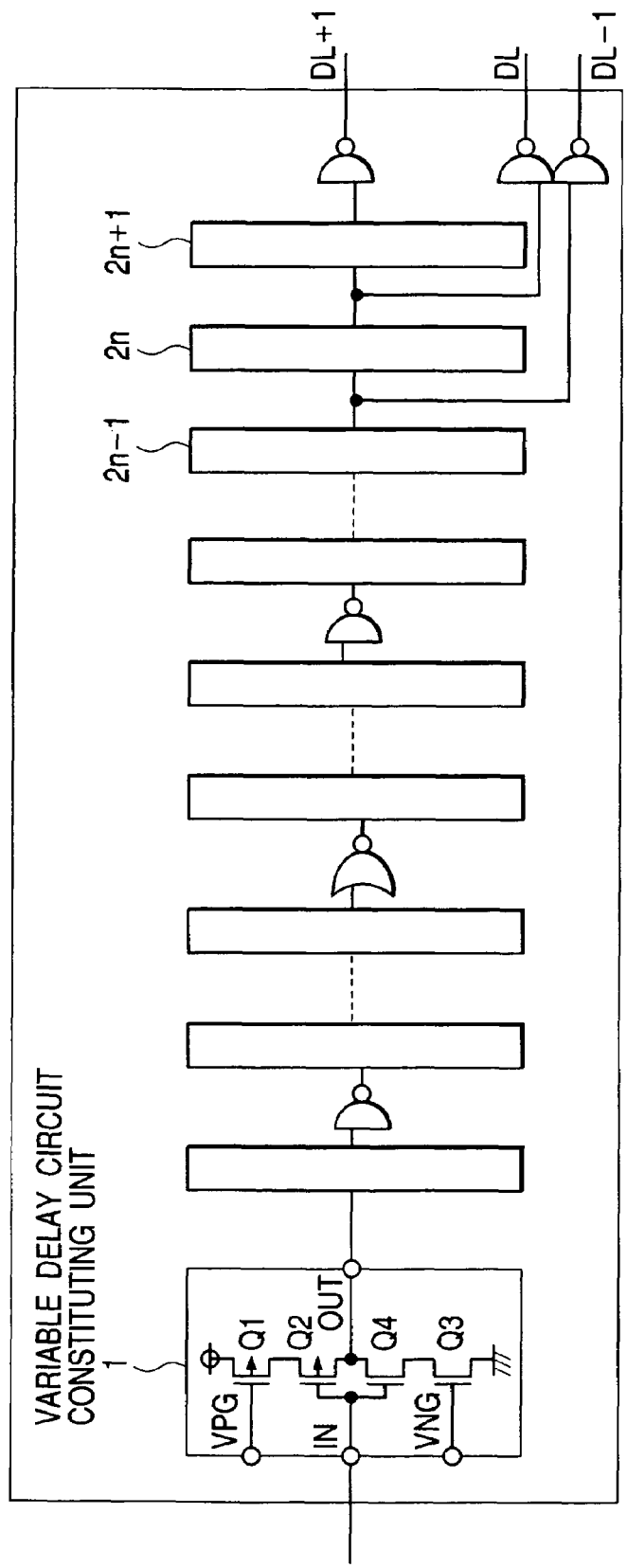
FIG. 2 is a circuit diagram illustrating an embodiment of a variable delay circuit used in the present invention.

FIG. 2 illustrates a circuit diagram of an embodiment of the variable delay circuit used in accordance with the present invention. The variable delay circuit of this embodiment is formed as a circuit, for outputting at the nodes of the delay circuits in the 2n−1 stage for the delay circuit DL−1, the 2n stage for the delay signal DL and the 2n+1 stage for the delay signal DL+1, by cascade-connecting a plurality of variable delay circuits that are configured using a CMOS inverter consisting of a P-channel MOSFET Q2 and an N-channel MOSFET Q4, which forms an output signal OUT from an input signal IN by controlling the respective currents with a gate voltage VPG of a P-channel MOSFET Q1 and gate voltage VNG of an N-channel MOSFET Q3. The gate provided in the course of the circuit operation is used to reset an output signal of the variable delay circuit for adjustment.

It is desirable for the MOSFETs Q1 and Q3 to constitute in parallel a P-channel MOSFET and N-channel MOSFET, which allow flow of a constant current by receiving a constant voltage in order to enable signal transmission when the absolute values of the control voltages VPG and VNG are lowered. Namely, since such a constant current MOSFET is provided, even if the absolute values of the control voltages VPG and VNG are lowered, and thereby the MOSFETs Q1 and Q3 are turned off, a stable delay operation can be realized by operating the CMOS inverter with the constant current and setting the maximum delay time in the unit delay circuit with such constant current.

Figure 3:
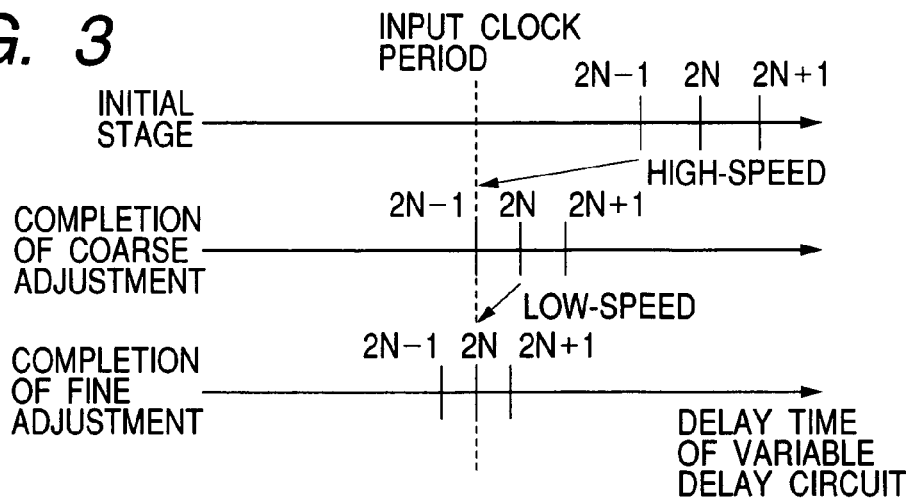
FIG. 3 is a diagram illustrating the synchronizing operation through coarse adjustment/fine adjustment in the DLL circuit of the present invention.

FIG. 3 is a diagram which illustrates the synchronizing operation of the coarse adjustment and fine adjustment in the DLL circuit of the present invention. In this figure, the input clock period is considerably smaller than the delay time of the variable delay circuit. That is, since the delay time of the variable delay circuit is too large, the coarse adjustment synchronizing operation is implemented for effecting matching between the delay signal DL−1 of the (2N−1)th stage of the variable delay circuit 1 and the input pulse. In this synchronizing operation, since the loop gain of the DLL circuit is set to a larger value, the delay signal DL−1 of the (2N−1)th stage is quickly matched with the input clock period.

When the synchronizing operation is completed through the coarse adjustment, the operation shifts to the fine adjustment synchronizing operation. In this fine adjustment synchronizing operation, since a loop gain of the DLL circuit is set to a smaller value, the standard delay signal DL of the 2Nth stage is gradually matched with the input clock period. Although the fine adjustment synchronizing operation is performed at a rather low speed, as described above, the phase control itself is performed within a short period corresponding to the delay time in one stage of the variable delay circuit 1. Accordingly, the time required for the synchronizing operation becomes rather short. Namely, the time required for the total synchronizing operation, including the coarse adjustment and fine adjustment processes, can be set to an extremely short period through completion of the synchronizing operation within a short period in the coarse adjustment operation. Moreover, a stable synchronizing operation at a higher accuracy, in other words, a synchronizing operation including less jitter, can be realized in order to finally realize the target synchronization with an input clock through use of the fine adjustment synchronizing operation.

Figure 4:
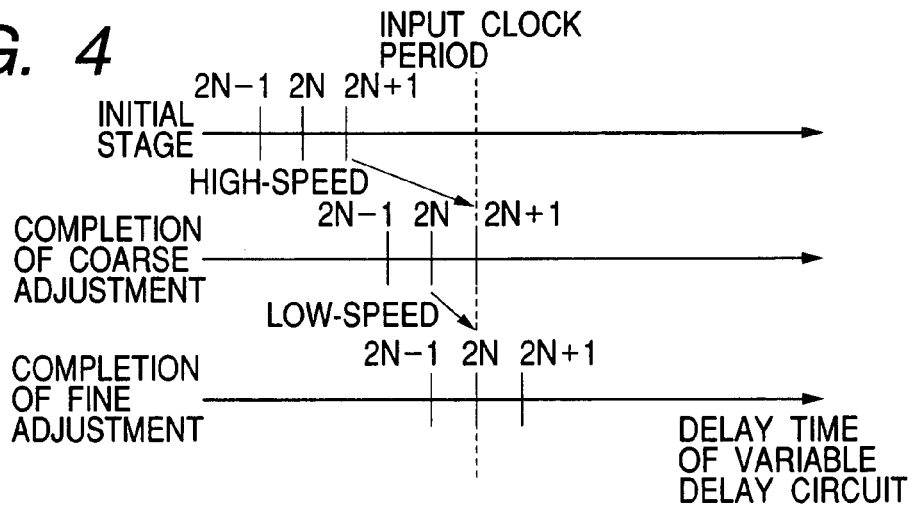
FIG. 4 is a diagram illustrating the synchronizing operation through coarse adjustment/fine adjustment in the DLL circuit of the present invention.

FIG. 4 is a diagram illustrating the coarse adjustment and fine adjustment synchronizing operation in the DLL circuit of the present invention. In this figure, in contrast to FIG. 3, the input clock period is set to be considerably larger than the delay time of the variable delay circuit. Namely, since the delay time of the variable delay circuit is too small, the coarse adjustment synchronizing operation can be implemented for effecting matching between the delay signal DL+1 of the (2N+1)th stage of the variable delay circuit 1 and the input pulse. In this synchronizing operation, since the loop gain of the DLL circuit is set to a larger value, the delay signal DL+1 of the (2N+1)th stage is quickly matched with the input clock period.

When the coarse adjustment synchronizing operation is completed, the operation shifts to the fine adjustment synchronizing operation. In this fine adjustment operation, since the loop gain of the DLL circuit is set to a smaller value, the standard delay signal DL of the 2Nth stage is gradually synchronized with the input clock period. As described above, although the fine adjustment operation is performed at a rather low speed, since the phase control itself is performed within a short period corresponding to the delay time in one stage of the variable delay circuit 1, the time required for the synchronizing operation becomes short, and moreover a stable synchronizing operation with less jitter can be realized.

Figure 5:
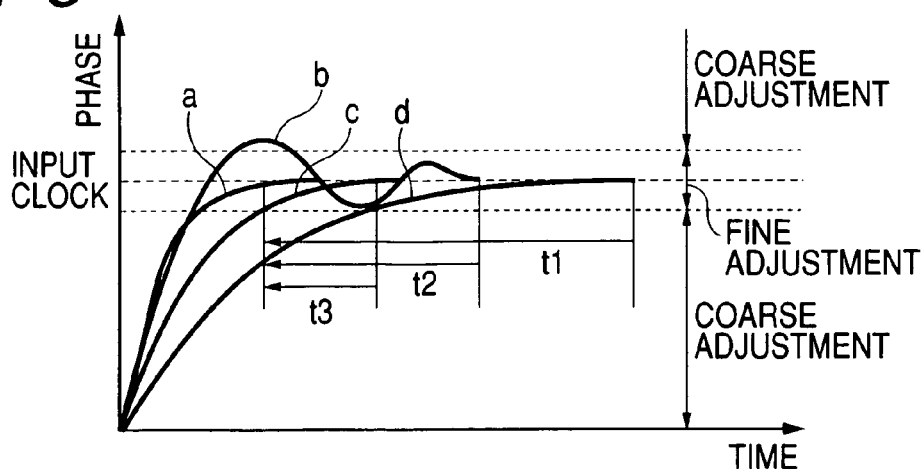
FIG. 5 is an operation characteristic diagram for the DLL circuit of the present invention.

FIG. 5 is an operation characteristic diagram for the DLL circuit of the present invention. In this figure, time is plotted on the horizontal axis, while phase (frequency) is plotted on the vertical axis. The DLL circuit of the present invention quickly changes the phase (frequency) by increasing the loop gain of the DLL circuit in the coarse adjustment range, as illustrated by the characteristic (a). In the fine adjustment region, the loop gain of the DLL circuit is lowered to gradually change the phase (frequency). Thereby, the phase can be synchronized to the target input clock within a short period of time.

Meanwhile, when the loop gain of the DLL circuit is kept constant, if the phase is controlled to rise quickly by setting the loop gain of the DLL circuit to a higher value, as illustrated by the characteristic (b), over-swing appears first, and the characteristic is converged while following the locus of vibration. Therefore, the time required until synchronization is obtained is extended by as much as t2. Although not illustrated, a problem arises in that jitter (swaying of phase) is generated due to excessive reaction to delicate phase deviation relative to the input pulse. Moreover, when an attempt is made to form a stable synchronizing clock, including less jitter, by setting the loop gain of the DLL, to a small value, as illustrated by the characteristic (d), the time required until synchronization is attained is further extended as much as t1. The characteristic (c) is an example of the characteristic obtained in the case where the optimum condition is set without any over-swing. Even when such an optimum condition is set, the time required until synchronization is attained is also extended as much as t3. When fluctuation or the like of the element characteristics is considered here, the synchronizing operation under the optimum condition is actually difficult to realize, and a time longer than the time t3 is required.

In accordance with the present invention, since it is not necessary to consider over-swing in the coarse adjustment range, while, on the contrary, since fine adjustment is started because the loop gain of the DLL is small and the operation is automatically changed over before matching is realized, even if the loop gain of the DLL circuit is set to a larger value and the signal thereby rises quickly, high speed convergence can be attained through the operation to realize gradual phase matching (synchronization) from the fine adjustment without any over-swing. Accordingly, a DLL circuit which simultaneously realizes both higher sensitivity (high response characteristic) and higher stability can be achieved.

Figure 6:
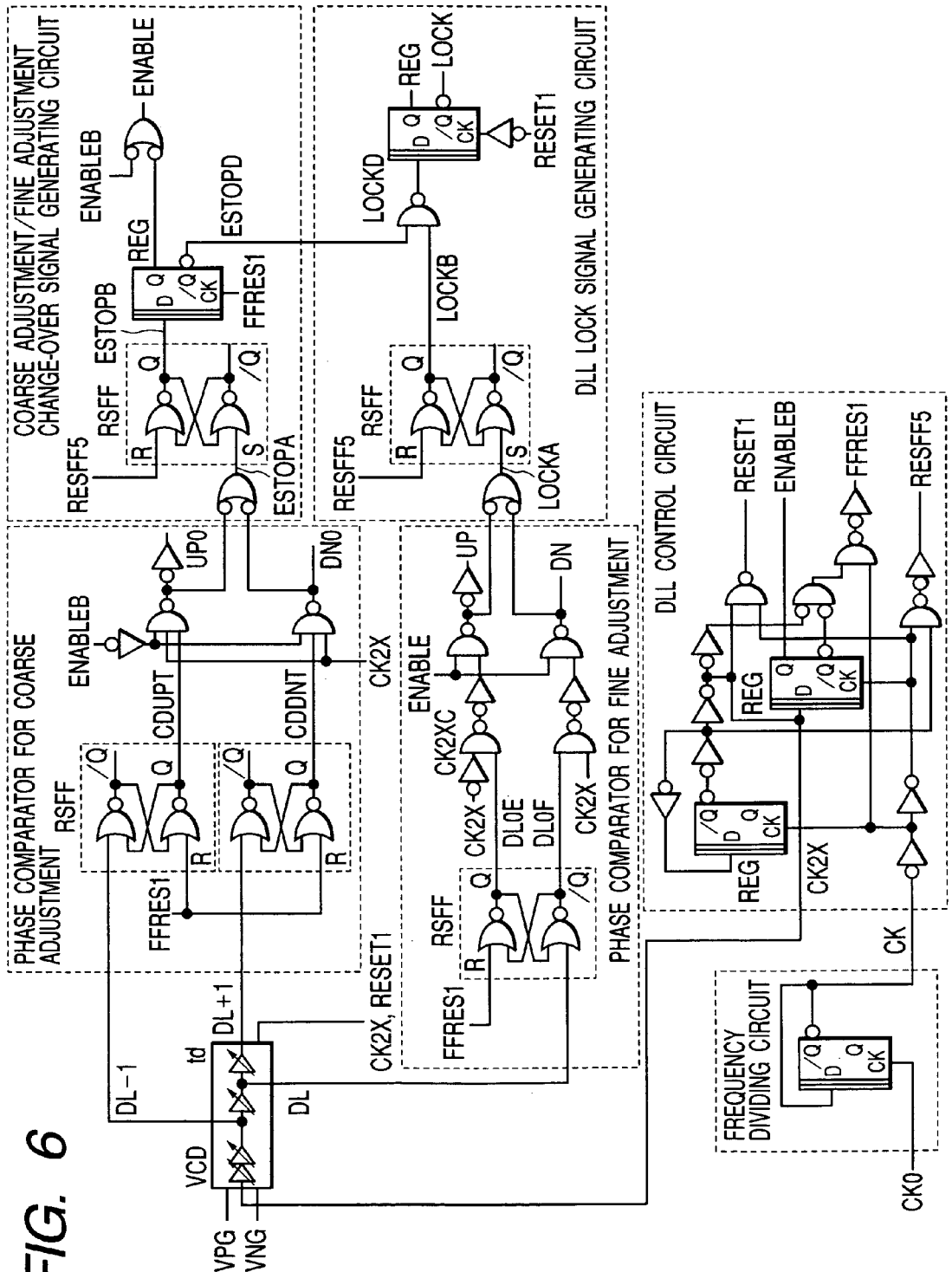
FIG. 6 is a circuit diagram illustrating an embodiment of a control system circuit of the DLL circuit of the present invention.

FIG. 6 is a circuit diagram of an embodiment of a control system circuit of the DLL circuit of the present invention. VCD is the variable delay circuit 1 which is used to form the standard delay signal DL to be synchronized with the input pulse, the delay signal DL−1 of one preceding stage, and the delay signal DL+1 of one subsequent stage, as described above. The control system circuit of this embodiment is constituted by the DLL control circuit, coarse adjustment phase comparator, fine adjustment phase comparator, coarse adjustment/fine adjustment change-over signal generating circuit and DLL LOCK signal generating circuit.

The DLL circuit of this embodiment is not configured to always compare the input pulse with the delayed pulse of the variable delay circuit VCD using the phase comparator, but to perform one phase comparing operation in every four periods of the input pulse using the control signal formed in the DLL control circuit. Namely, in the DLL control circuit, a latch circuit REG forms the pulse which is divided in frequency to ¼, and this frequency-divided pulse is then combined with the input pulse CK. Thereby, the set pulses RESET1, FFRES1, RESFF5 are formed once in every four periods of the input pulse CK, and the enable signal ENABLEB which validates the phase comparison operation can also be formed.

The phase comparator for coarse adjustment forms the pulse CDUPT under the condition that the delay is too large, by setting, with the delay signal DL−1, one flip-flop circuit RSFF, which has been reset by the reset pulse FFRES1 generated by the DLL control circuit, and it also forms an up signal UP0 through comparison of the pulse DCUPT with the input pulse CK2X (¼ frequency division pulse of the input pulse CK0). On the contrary, the pulse CDDNT, under the condition that the delay is too small, is generated by setting, with the delay signal DL+1, the other flip-flop circuit RSFF, which has been reset by the reset pulse FFRES1, and this pulse CDDNT is then compared with the input pulse CK2X (¼ frequency division pulse of the input pulse CK0). Thereby, the down signal DN0 is formed.

With the structure described above, the phase comparator for coarse adjustment forms the up signal UP0 when the phase of the delay signal DL−1 is delayed from the input pulse CK0 (CK2X), and it also forms the down signal DN0 when the phase of the delay signal DL+1 is leading for the input pulse CK0 (CK2X). In other cases, namely when the phase difference between the standard delay signal DL and input pulse is in the range of DL−1 and DL+1, the signals UP0, DN0 are never formed.

When the up signal UP0 or down signal DN0 is formed, the flip-flop circuit RSFF of the coarse adjustment/fine adjustment change-over signal generating circuit is set. This flip-flop circuit RSFF is comprised of the latch circuit REG to generate an enable signal ENBLE via a gate circuit. This signal ENBLE validates the operations of the phase comparator for fine adjustment.

The phase comparator for fine adjustment forms the comparison pulses DL0E and DL0F by setting, with the delay signal DL, the flip-flop circuit RSFF which has been reset by the reset pulse FFRES1 generated by the DLL control circuit, and it also forms the up signal UP and down signal DN through comparison with the input pulse CK2X (¼ frequency division pulse of the input pulse CK0). The enable signal ENBLE is used to form the up signal UP and down signal DN.

In the phase comparator for fine adjustment, the up signal UP and down signal DN are never generated under the lock condition where the phase of the input pulse CX2 is matched with the phase of the delay signal DL. The DLL LOCK signal generating circuit detects, with the flip-flop circuit RSFF, that neither the up signal UP nor the down signal DN is ever generated, and it generates a lock detection signal LOCK with the logical operation with the synchronization signal from the coarse adjustment/fine adjustment change-over signal generating circuit. Although the invention is not particularly so restricted, this lock detection signal LOCK is used to indicate to the other circuits that the DLL circuit is in the lock condition. The DLL circuit does not require the DLL LOCK detection signal generating circuit as an essential circuit, and it uses it as required depending on the request from the circuit which uses the DLL circuit.

In this embodiment, phase synchronization within a short period of time and stability under the synchronized condition are realized through combination of the phase comparator for coarse adjustment, phase comparator for fine adjustment, coarse adjustment/fine adjustment change-over signal generating circuit for changing over these comparators and the DLL control circuit for controlling the operations of these elements. Under the synchronized condition described above, if the period of the input pulse changes to a large extent exceeding the ranges of DL−1 and DL+1 of the phase difference between the standard delay signal DL and input pulse for some reason, the phase comparator for coarse adjustment forms again the up signal UP0 or down signal DN0. Accordingly, since the coarse adjustment/fine adjustment change-over signal generating circuit restricts an output signal of the phase comparator for fine adjustment and gives priority to the output signal UP0 or DN0 of the phase comparator for coarse adjustment, the phase control operation is performed to bring the phase difference between the standard delay signal DL and input pulse into the range of DL−1 and DL+1 within an extremely short period of time, and, thereafter, the synchronizing operation with the phase comparator for fine adjustment is implemented.

Figure 7:
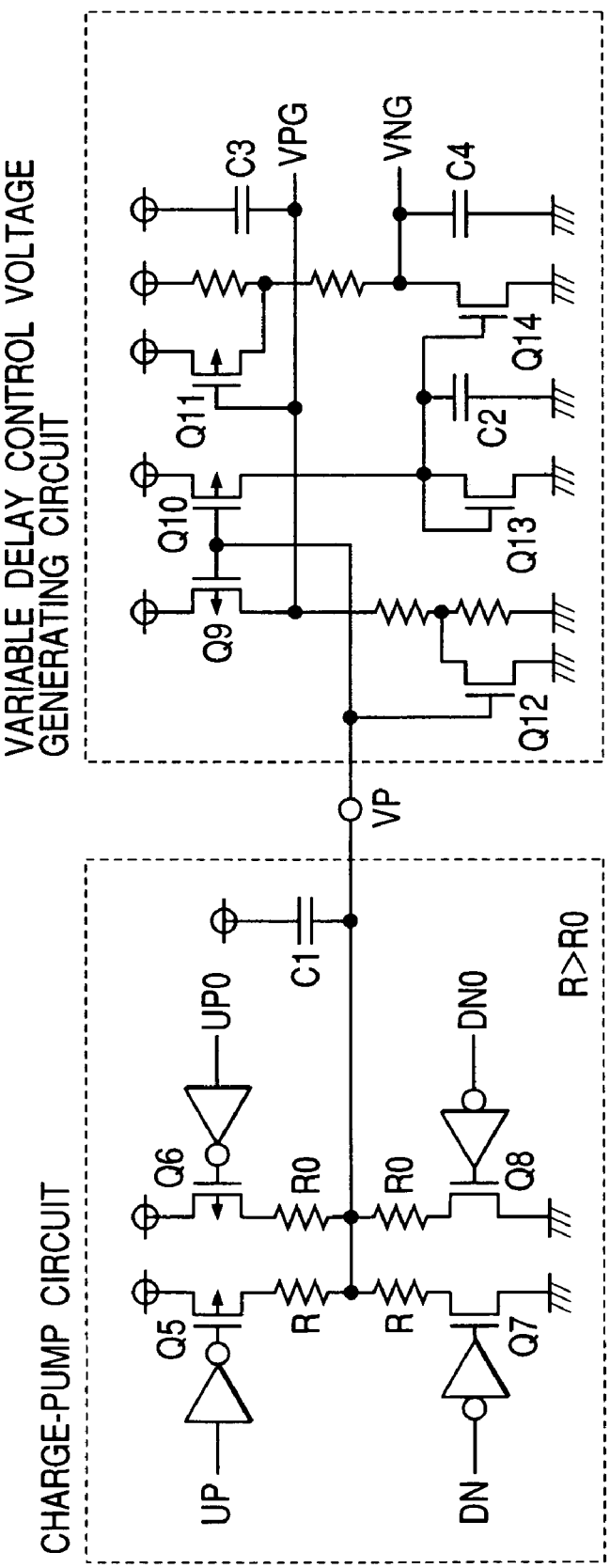
FIG. 7 is a circuit diagram illustrating an embodiment of a charge pump & filter of FIG. 1.

FIG. 7 is a circuit diagram showing an embodiment of the charge pump & filter of FIG. 1. In addition to the charge pump circuit, a variable delay control voltage generating circuit is further added to the charge pump & filter of this embodiment. The up signal UP is supplied to a gate of a P-channel MOSFET Q5 via an inverter circuit in order to allow a current to flow, thereby to raise the holding voltage of a smoothing capacitor C1 via a resistor R. The down signal Dn is supplied to a gate of an N-channel MOSFET Q7 via an inverter circuit in order to allow a current to flow, thereby to lower the holding voltage of the smoothing capacitor C1 via the resistor R.

The up signal UP0 described above is supplied to a gate of a P-channel MOSFET Q6 via an inverter circuit, and it allows a current to flow, thereby to raise the holding voltage of the smoothing capacitor C1 via a resistor R0. The down signal DN0 is supplied to a gate of an N-channel MOSFET Q8 via an inverter, and it allows a current to flow, thereby to lower the holding voltage of the capacitor C1 via the resistor R0.

Here, quick change of phase in the coarse adjustment operation can be realized through an increase of the current to change the holding voltage of the capacitor C1 with the coarse adjustment signal UP0 or DN0, namely through increase of the loop gain of the DLL circuit, by setting the conductance of the MOSFETs Q5 to Q8 to satisfy the relationships of Q6<Q5, Q7<Q8, and also by setting the resistance value of the resistor to satisfy the relationship of R>R0. On the contrary, a gradual change of phase in the fine adjustment can be realized through a decrease of the current to change the holding voltage of the capacitor C1 with the fine adjustment signal UP or DN, namely through a decrease of the loop gain of the DLL, circuit by reducing the current flowing into the MOSFETs Q5 and Q7, and thereby increasing the resistance value of the resistor R.

Figure 8:
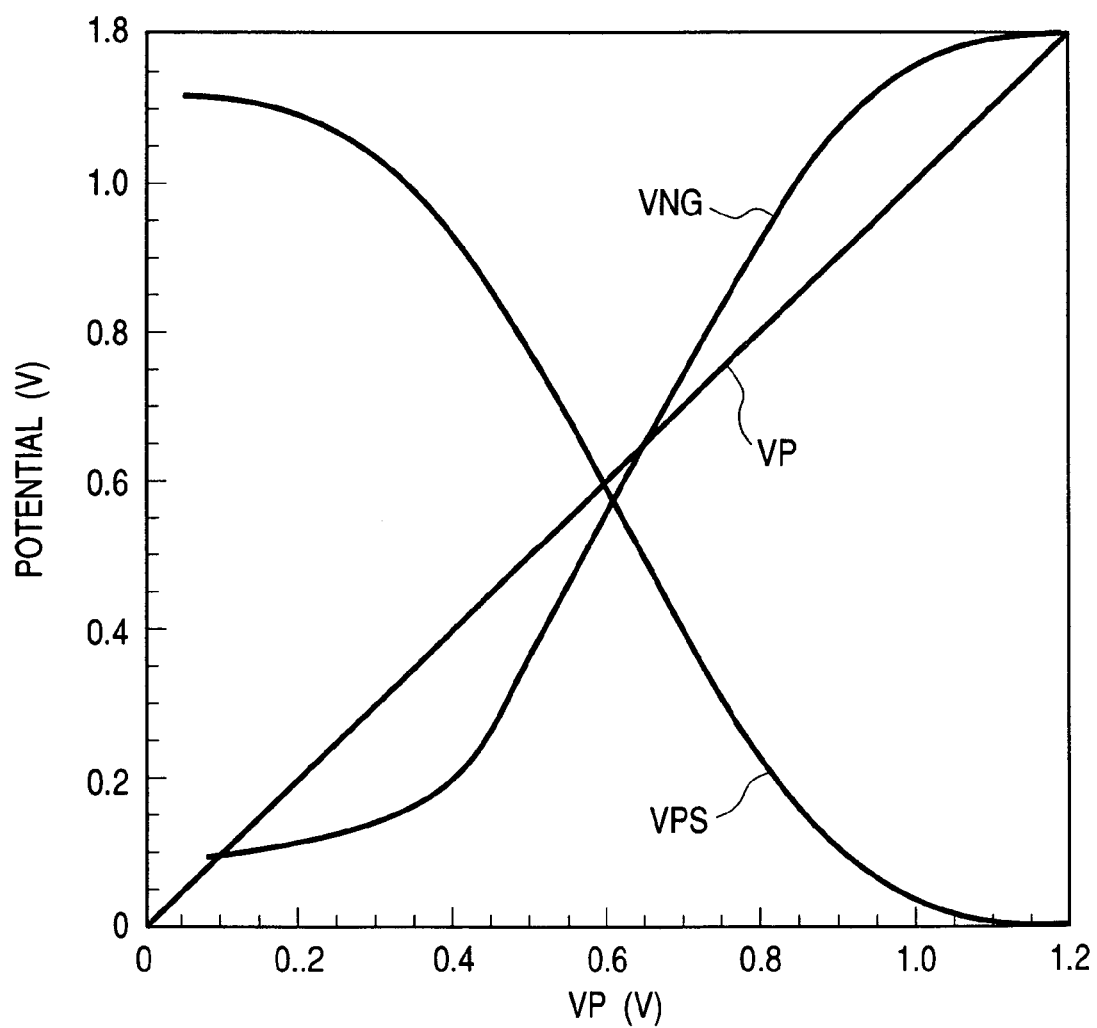
FIG. 8 is a voltage conversion characteristic of a variable delay control voltage generating circuit of FIG. 7.

The holding voltage VP of the capacitor C1 is converted to the control voltages VNG and VPG, as illustrated in FIG. 8, using the variable delay control voltage generating circuit. Namely, the voltage VP is supplied to the gates of the P-channel MOSFETs Q9 and Q10 and is then converted to current signals. The current of the MOSFET Q9 is used to discharge a capacitor C3; a MOSFET Q12, which receives the voltage VP at the gate thereof, and a resistor connected to this transistor Q12 constitute the charge current path of the capacitor C3; and the control voltage VPG, which is obtained by inverting the voltage VP, can be formed through combining with the discharge current of the MOSFET Q9. This control voltage VPG is supplied to the gate of the P-channel MOSFET Q1 or the like of FIG. 2.

The current formed by the MOSFET Q10 is supplied a current Miller circuit consisting of the N-channel MOSFETs Q13 and Q14, and an output current of this Miller circuit is used as a discharge current of a capacitor C4. A MOSFET Q11, which receives the voltage VPG at the gate thereof, and a resistor connected to this Q11 form a charge current path of the capacitor C4, and the control voltage VNG which changes like the voltage VP, is formed in combination with the discharge current of the MOSFET Q14. This control voltage VNG is supplied to the gate of the N-channel MOSFET Q3 or the like of FIG. 2.

The operation current control range of the CMOS inverter circuit forming the variable delay circuit can be widened by converting the voltage VP formed by the capacitor C1 for smoothing the phase comparison output to the complementary control voltages VPG and VNG, as described above, and, as a result, the variable delay range in the CMOS inverter circuit can also be widened. In this case, it is desirable to respectively provide, in the variable delaying stage of FIG. 2, the P-channel MOSFET and N-channel MOSFET, which can supply a constant current to the MOSFETs Q1 and Q3, corresponding to the maximum delay time in the parallel condition.

Figure 9A:
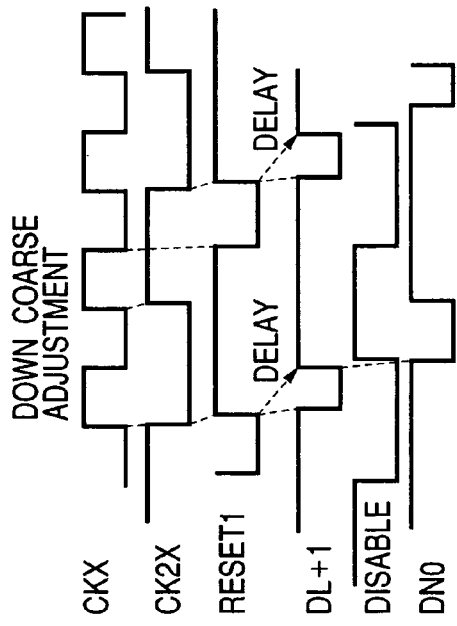
FIGS. 9(a) to 9(d) are waveform diagrams illustrating the operations of the DLL circuit of the present invention.
Figure 9B:
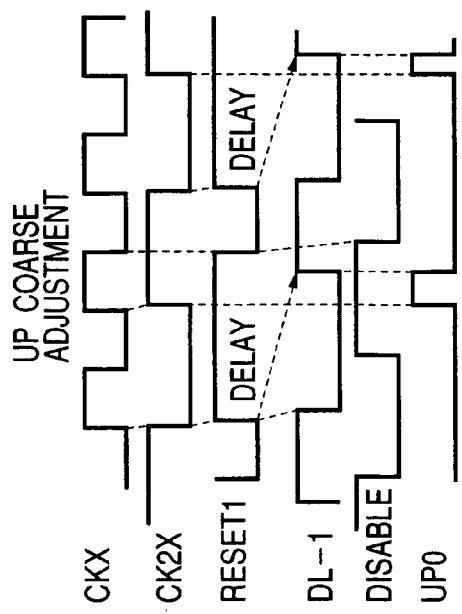
Figure 9C:
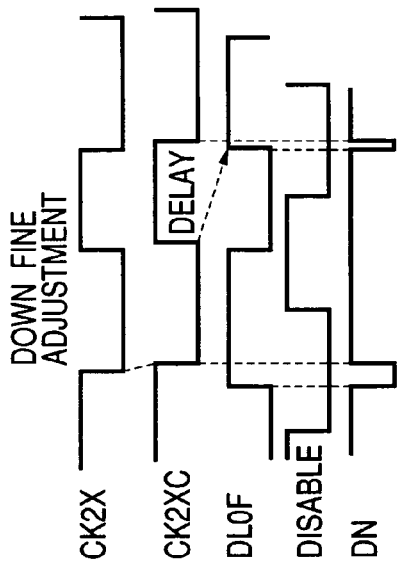
Figure 9D:
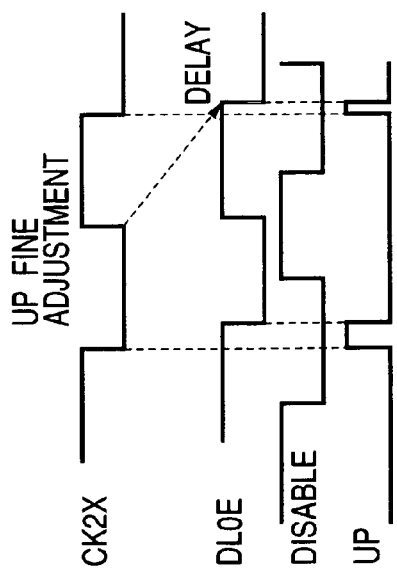

FIGS. 9(a) to 9(d) are waveform diagrams illustrating the operations of the DLL circuit of the present invention. FIG. 9(a) is a waveform diagram under the up-frequency (UP) condition in the coarse adjustment, while FIG. 9(b) is a waveform diagram under the down-frequency (DN) condition in the coarse adjustment, FIG. 9(c) is a waveform diagram under the up-frequency (UP) condition in the fine adjustment, and FIG. 9(d) is a waveform diagram under the down-frequency (DN) condition in the fine adjustment.

As shown in FIG. 9(a), in the UP coarse adjusting operation, a phase difference between rises of the ½ frequency division pulse CK2X of the input pulse CKX and the delay signal DL−1 (CDUPT in FIG. 6) is outputted as the up signal UP0 during the high level period of the signal DISABLE (=low level period of the enable signal ENABLEB). This signal UP0 raises the potential VP of the capacitor C1; the gate control voltage VNG of the N-channel MOSFET Q3 rises conforming to the characteristic of FIG. 8 in order to increase the current; and the gate control voltage VPG of the P-channel MOSFET Q1 decreases in order to increase the current. Thereby, the delay time in the unit variable delay stage becomes short, and phase matching between the delay signal DL−1 and the input pulse CK2X is performed quickly, as illustrated in FIG. 3.

As shown in FIG. 9(c), the UP fine adjusting operation is selected and executed after completion of the coarse adjustment. With this operation, the up signal UP is formed corresponding to the phase difference between the input pulse CK2X and the delay signal DL0E so as to increase the potential VP of the capacitor C1, as described above. Thereby, the delay time of the unit variable delay circuit is shortened, conforming to the characteristic of FIG. 8. In this case, since the rate of change of the voltage VP of the capacitor C1 due to the up signal UP becomes small, in other words, since the loop gain of the DLL circuit is small, the changing width of the delay time in the variable delay circuit 1 is also reduced.

As shown in FIG. 9(b), in the DOWN coarse adjusting operation, the phase difference between rises of the delay signal DL+1 (CDDNT of FIG. 6) and the ½ frequency division pulse CK2X of the input pulse CKX is outputted as the down signal DN0 during the high level period of the signal DISABLE (=low level period of the enable signal ENABLEB). This signal DN0 reduces the potential VP of the capacitor C1. Thereby, the gate control voltage VNG of the N-channel MOSFET Q3 falls, conforming to the characteristic of FIG. 8, as described above, to reduce the current, and the gate control voltage VPG of the P-channel MOSFET Q1 rises to reduce the current. Accordingly, the delay time in the unit variable delay stage becomes long, and phase matching is performed quickly between the delay signal DL+1 and input pulse CK2X, as illustrated in FIG. 4.

As shown in FIG. 9(d), the DOWN fine adjusting operation is selected and executed after completion of the coarse adjustment. With this operation, the down signal DN is formed corresponding to the phase difference between the input pulse CK2X and the delay signal DL0F. Accordingly, the potential VP of the capacitor C1 is reduced, as described above, and the delay time of the unit variable delay circuit becomes longer conforming to the characteristic of FIG. 8. In this case, since the rate of change of the voltage VP of the capacitor C1 due to the down signal DN is small, in other words, since the loop gain of the DLL circuit is small, the changing width of the delay time in the variable delay circuit 1 is also reduced.

Figure 10B:
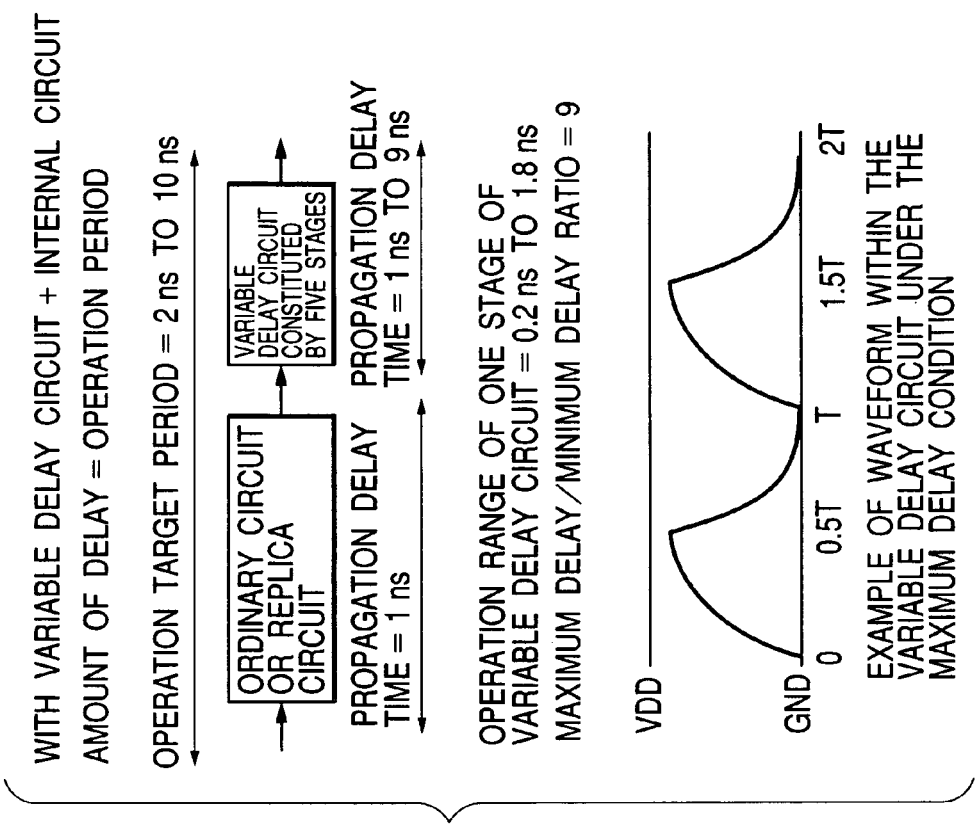
FIGS. 10(*a*) and 10(*b*) are diagrams illustrating requested operation ranges of the variable delay circuit in relation to the present invention.
Figure 10A:
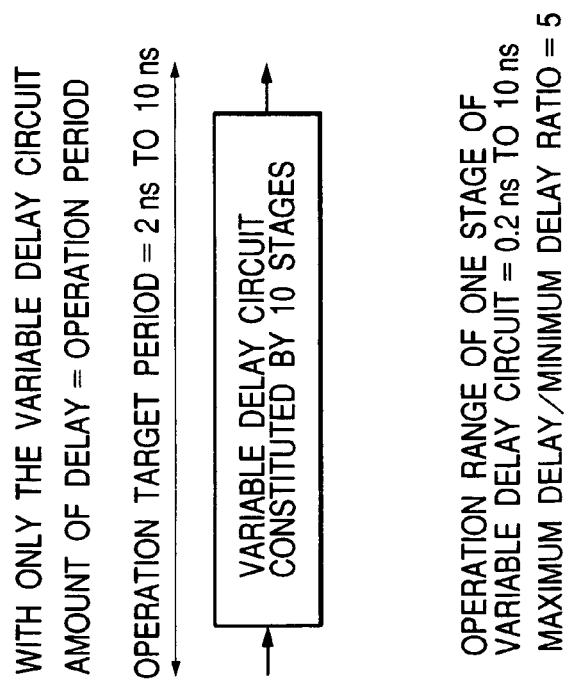

FIGS. 10(a) and 10(b) are diagrams for which illustrate the requested operation range of the variable delay circuit. In FIG. 10(a), the operation target period is controlled only with the variable delay circuit. For example, when the operation target period is 2 ns to 10 ns, the unit variable delay stage of FIG. 2 is constituted by 10 stages thereof. Meanwhile, in FIG. 10(b), the unit variable delay stage formed of a variable delay circuit plus an internal circuit. As the internal circuit, an ordinary circuit and a replica circuit are used. In this example, since the fixed delay time of 1 ns in the ordinary circuit and replica circuit is included to realize a operation target period of 2 ns to 10 ns, as described above, a unit delay circuit of five stages is used as the variable delay circuit, and it is therefore required to realize a delay time of 1 ns to 9 ns with such a unit variable delay circuit of five stages.

In FIG. 10(a), the operation range per stage of the variable delay circuit is from 0.2 ns to 1.0 ns, resulting in the maximum delay/minimum delay ratio of 5. Meanwhile, in FIG. 10(b), the operation range per stage of the variable delay circuit is from 0.2 ns to 1.8 ns, resulting in a maximum delay/minimum delay ratio of 9. This fact suggests that, when the circuit is formed of the same identical elements, the internal waveform of the variable delay circuit under the maximum delay condition can be considered as the signal having the full amplitude in the range of the operation voltage VDD-VSS.

However, in FIG. 10(b), the internal waveform of the variable delay circuit under the maximum delay condition cannot exhibit the full amplitude in the range of the operation voltage VDD-VSS. Namely, when the signal rises slowly because the operation current of the CMOS inverter circuit is narrowed to rise slowly (or falls slowly), with a view toward obtaining a longer delay time, the input signal changes to the high level before it reaches the power supply voltage VDD and thereby causes the output signal to fall.

As described above, it is difficult to equally set the currents of the P-channel MOSFET and N-channel MOSFET in the structure to change the delay time by controlling the operation current of the CMOS inverter circuit with the MOSFETs Q1 and Q3, and there exists an offset which makes desired any current large. As a result, a problem arises in that the pulse to be transmitted disappears in the course of the sequential transmission of the signal, which cannot exhibit a full amplitude, as described above. Accordingly, even in the case of obtaining the predetermined delay time with only the variable delay circuit illustrated in FIG. 10(a), a problem arises, as in the case of FIG. 10(b), in that the pulse to be transmitted disappears in the course of the sequential transmission of the signal, which cannot exhibit a full amplitude because the input pulse frequency becomes high.

FIGS. 11(a) and 11(b) are diagrams illustrating examples of the measures taken in the case of disappearance of the pulse, as illustrated in FIGS. 10(a) and 10(b). In FIG. 11(a), the variable delay circuit is operated in a doubled period by dividing the frequency of the input pulse to ½, while in FIG. 11(b), the variable delay circuit is operated in a period of four (4) times by dividing the frequency of the input pulse to ¼. With such ½ frequency division, the operation target period of 2 ns to 10 ns can be expanded to 4 ns to 20 ns, and with such ¼ frequency division, the operation target period of 2 ns to 10 ns can be expanded to 8 ns to 40 ns.

Accordingly, when the fixed delay time of the replica circuit can be assumed to be 1 ns, the number of stages of the unit variable delay stage of the variable delay circuit can be increased up to 16 stages in the case of the ½ frequency division, while it can be increased up to 32 stages in the case of the ¼ frequency division. As a result, in the case of the ½ frequency division, the operation range per stage of the variable delay circuit is from 0.2 ns to 1.27 ns, resulting in a maximum delay/minimum delay ratio of 6.33. In the case of the ¼ frequency division, the operation range is from 0.2 ns to 1.11 ns, resulting in a maximum delay/minimum delay ratio of 5.55. Moreover, the internal waveform of the variable delay circuit under the maximum delay condition can be defined, as illustrated in FIG. 10(a), as a signal exhibiting a full amplitude in the range of the operation voltage VDD-VSS.

Since the variable delay circuit 1 executes phase synchronizing control in the circuit of the embodiment illustrated in FIG. 1, disappearance of a pulse in the variable delay circuit 1 can be prevented by providing the frequency divider as described above to extend the period of the pulse to be transmitted. Meanwhile, since the variable delay circuit 2 has to delay the signal while the input signal period is maintained, the waveform can easily disappear for the reason described above. In the embodiment of FIG. 1, a multiphase signal for reducing the operation period of the variable delay circuit 2 is generated, and this multiphase signal is then transmitted to the variable delay circuit 2 in order to prevent deformation or disappearance of the signal waveform. The problem of such disappearance and deformation of the pulse can be solved by using the waveform combining circuit to recover the signal having the original period from a plurality of signals.

Figure 12:
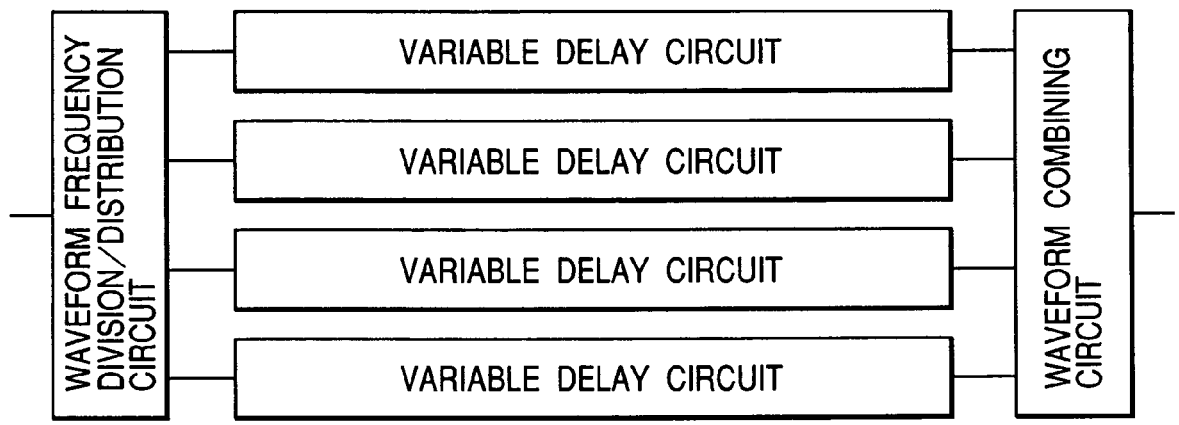
FIG. 12 is a block diagram illustrating an embodiment of a frequency divider/distributor, a variable delay circuit and a waveform combiner.

FIG. 12 illustrates a block diagram of an embodiment of the frequency divider/distributor, the variable delay circuit 2 and the waveform combiner of FIG. 1. In this embodiment, the input pulse is frequency-divided to ¼ by the waveform frequency dividing and distributing circuit and distributed to four pulses having phases which are different in every half-period from the phase of the input pulse. These four pulses are then transferred to the four variable delay circuits. The waveform combining circuit combines four delay signals to regenerate an output signal having a period equal to that of the input pulse.

Figure 13:
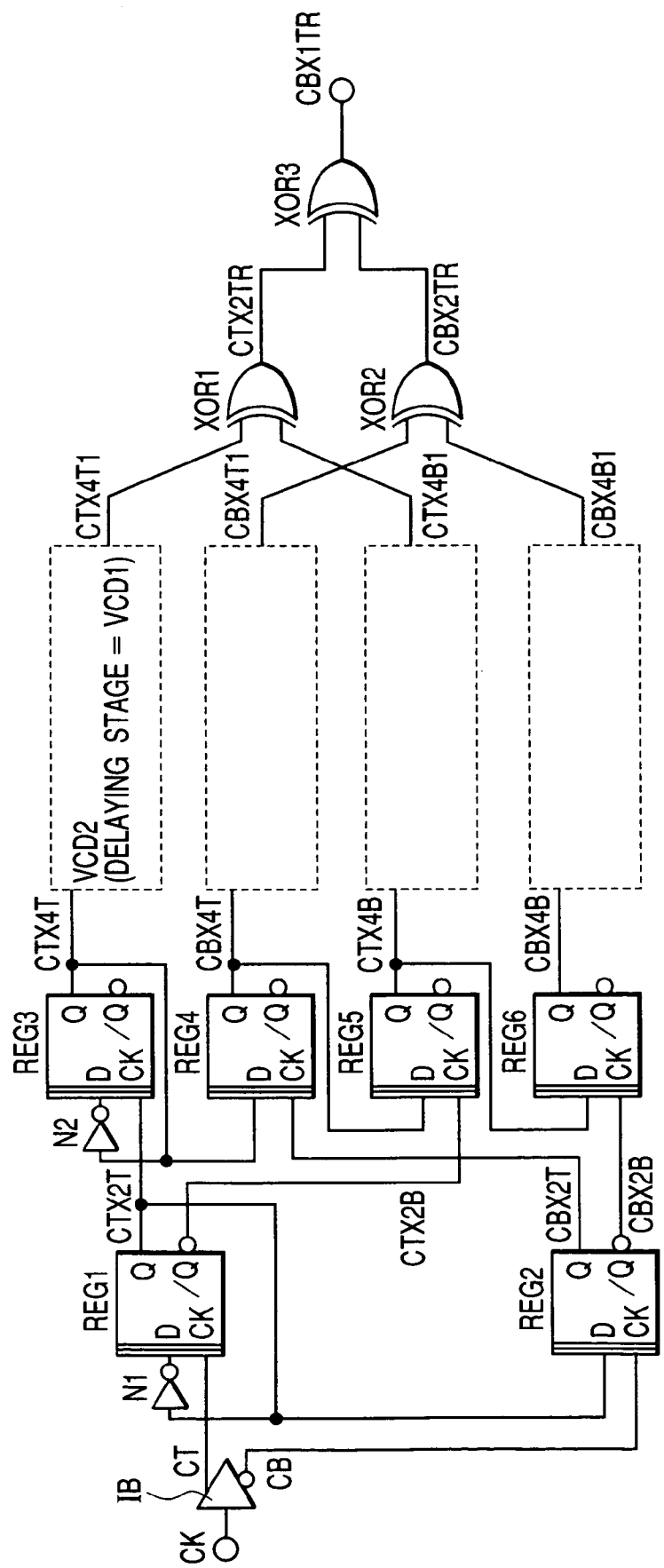
FIG. 13 is a circuit diagram illustrating an embodiment of the frequency divider/distributor, variable delay circuit and waveform combiner of FIG. 12.
Figure 14:
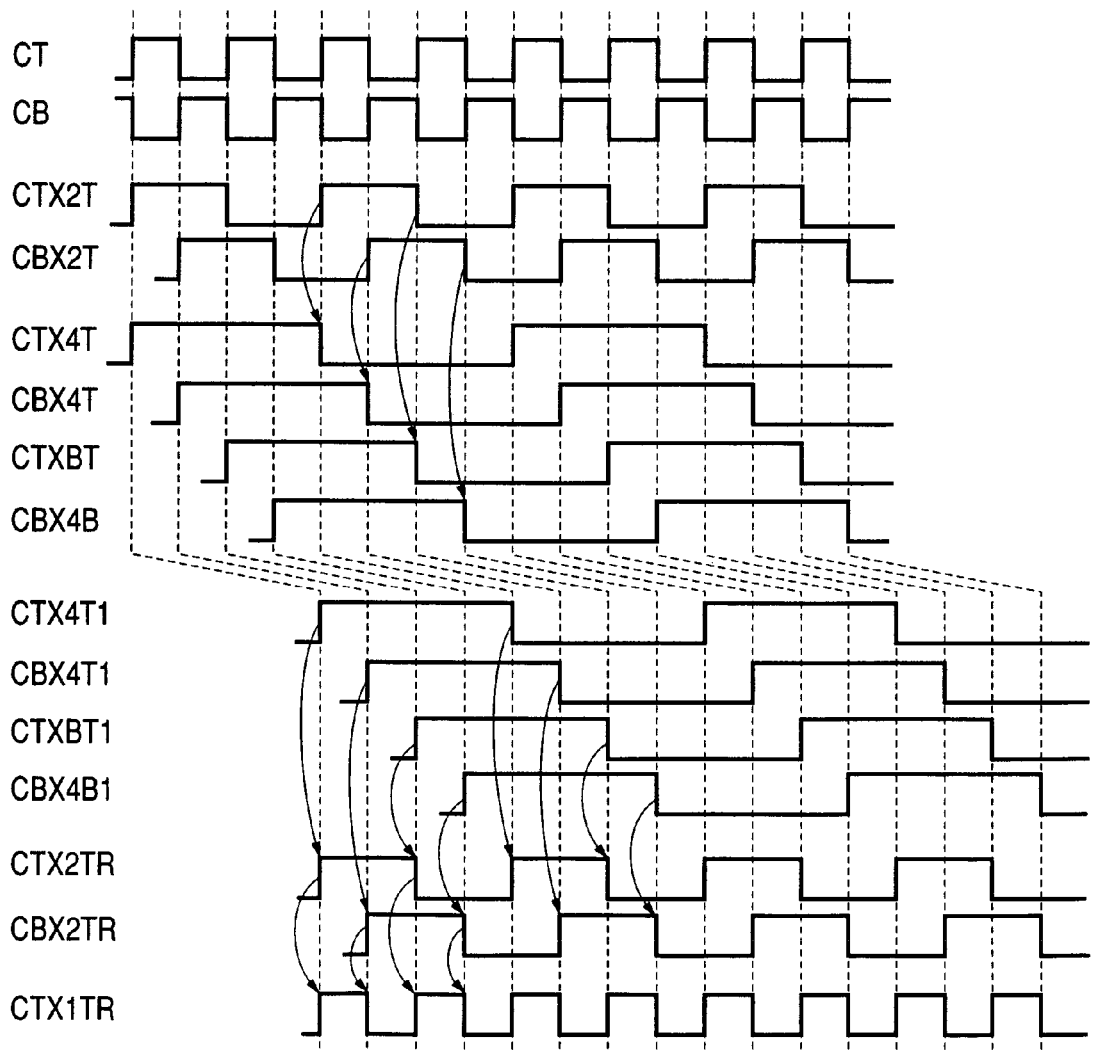
FIG. 14 is an operation waveform diagram illustrating operations of the circuit of FIG. 13.

FIG. 13 illustrates a circuit diagram of an embodiment of the frequency divider/distributor, the variable delay circuit 2 and the waveform combiner of FIG. 12. The input pulse CK is applied to an input buffer IB to form a normal phase output CT and an inverted phase output CB, as illustrated in the operation waveform diagram of FIG. 14. These outputs are frequency-divided using registers (½ frequency dividers) REG1, REG2. Thereby, the signal CTX2T (inverted signal CXT2B not illustrated) and the signal CBX2T (inverted signal CBX2B not illustrated) can be formed.

The respective output signals are fed back to the other register to realize the ½ frequency dividing operation using the signals CTX2T, CXT2B and CBX2T, CBX2B as the clocks of registers (½ frequency dividers) REG3 to REG6. Thereby, the four pulses CTX4T, CBX4T, CTX4B, CBX4B, having a period of four times and deviated in phase every half-period from the input pulse CK, are formed, and these pulses are then transferred to the variable delay circuit VCD2 in the same number of delaying stages as the variable delay circuit 1 (VCD1) of FIG. 1. An output signal CTX1TR corresponding to the original pulse can be regenerated from these delay signals through the waveform combining circuit, which is formed of the exclusive OR circuits XOR1, XOR2 and XOR3. This structure can effectively prevent disappearance and deformation of a pulse in the variable delay circuit VCD2 and can generate an output signal CTX1TR which is accurately phase-synchronized in a frequency range up to the higher frequency band.

Figure 15:
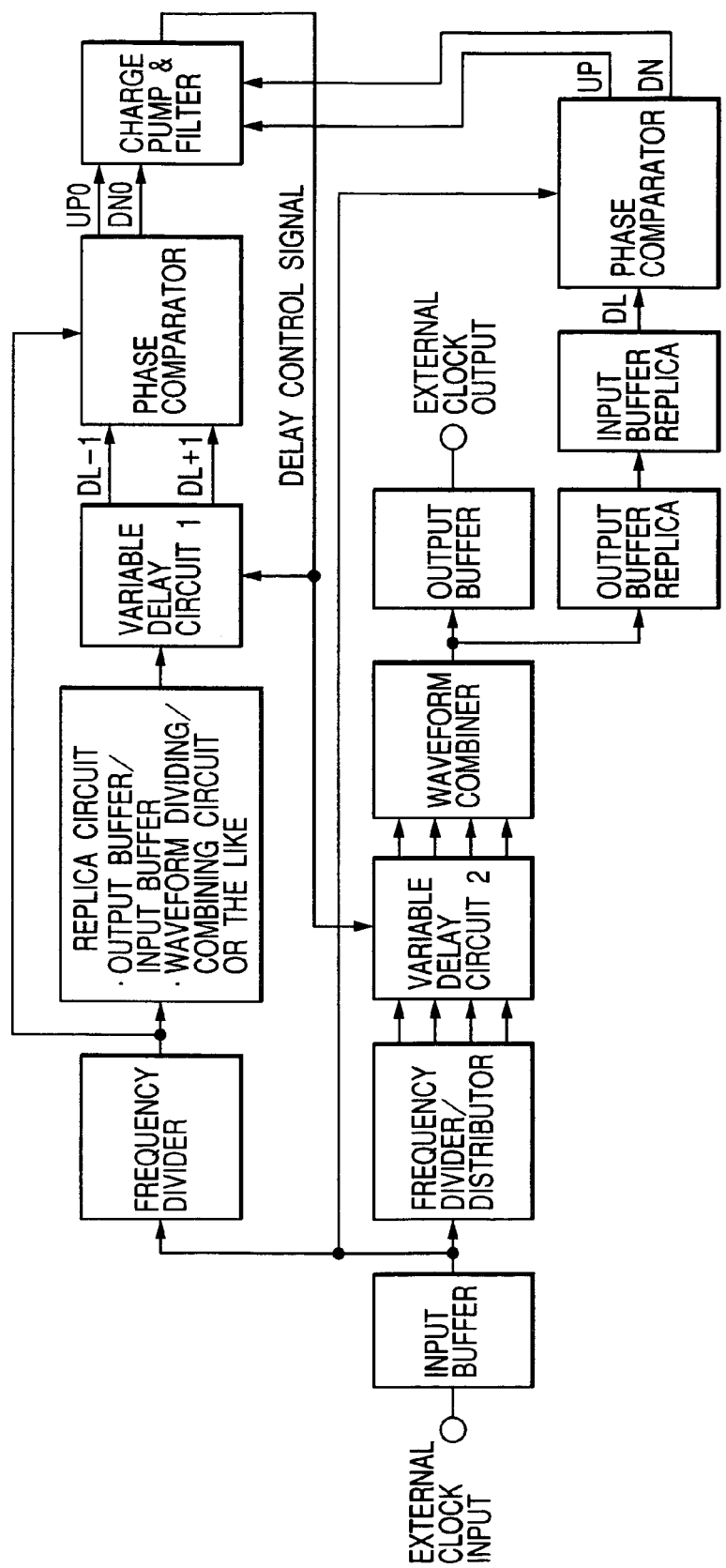
FIG. 15 is a block diagram illustrating another embodiment of the DLL circuit of the present invention.

FIG. 15 illustrates a block diagram of another embodiment of the DLL circuit of the present invention. In this embodiment, the phase comparator for fine adjustment is located, for example, in another area. As the signals compared by the phase comparator for fine adjustment, the output signal of the input buffer is compared with an output signal of the input section for external clock output provided with the other output buffer and input buffer (replica circuit). Accordingly, direct phase synchronization can be performed through comparison with an output of the input buffer, namely with the delay signal which is actually outputted.

In the embodiment described above, the circuit structure can be ready for a longer period owing to the technology introduced to the variable delay circuit 2 of FIG. 1 and thereby can expand the operation range. Moreover, since the operation range is separated for the coarse adjustment and fine adjustment, if the phase is deviated to a large extent, quick phase matching can be realized by suppressing over-swing. Because of separation of the operation range for the coarse adjustment and fine adjustment, jitter can be reduced by setting a small step for fine adjustment. Therefore, if the phase relative to the input pulse is largely deviated from the locked condition for some reason, the coarse adjustment circuit automatically operates to realize quick matching of the phase. Namely, since the operation range is separated for the coarse adjustment and fine adjustment, the coarse adjustment circuit operates when the phase deviation exceeds the range of fine adjustment (as many as variable delay forming unit of ±1 stage) and the phase can be matched with the fine adjustment operation when the period becomes small (less than the variable delay forming unit of ±1 stage).

Figure 16:
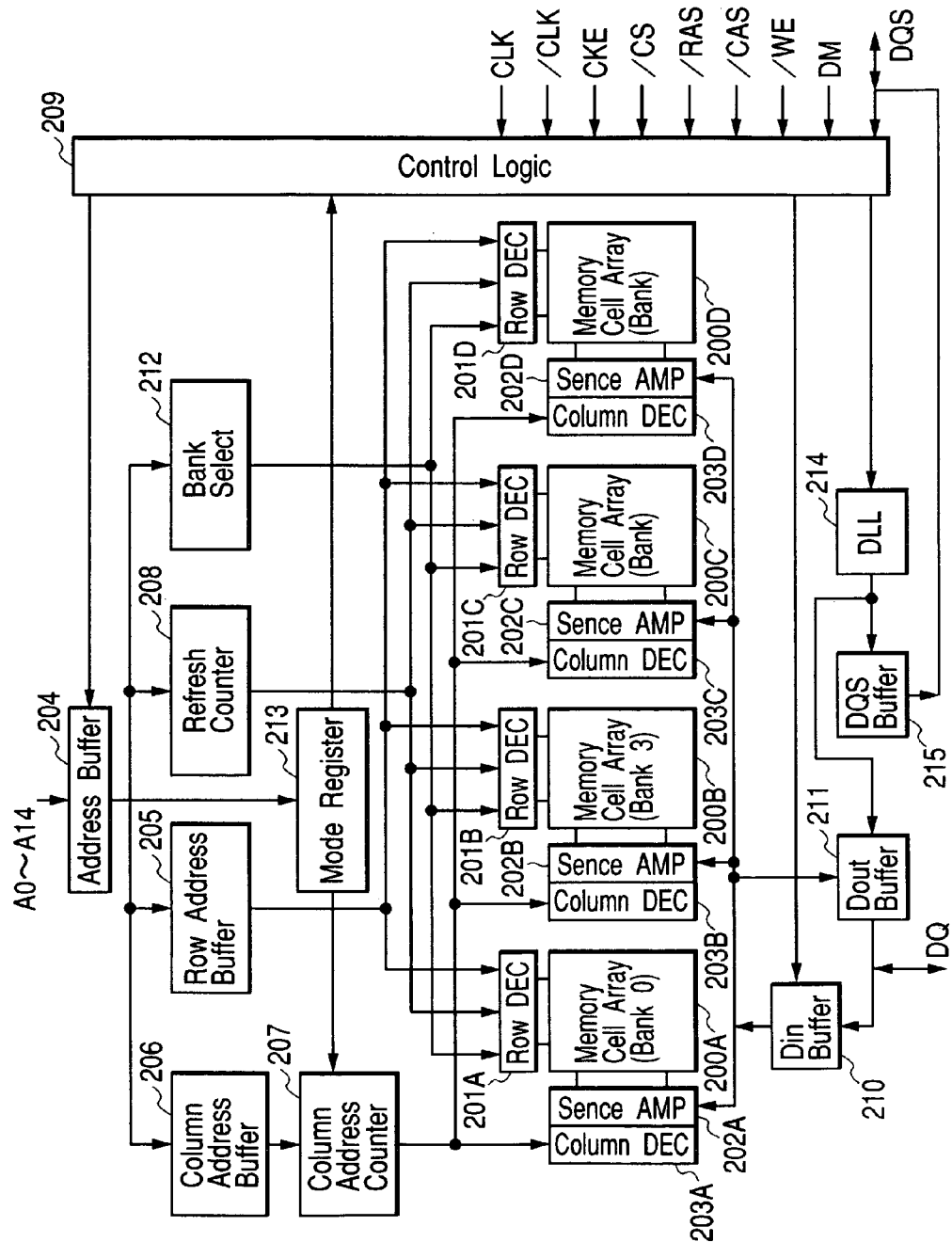
FIG. 16 is a block diagram illustrating an embodiment of a DDR, SDRAM to which the present invention is applied.

FIG. 16 illustrates an overall block diagram of an embodiment of a DDR SDRAM (Double Data Rate Synchronous Dynamic Random Access Memory) to which the present invention is adapted. The DDR SDRAM of this embodiment is provided, although the invention is not particularly so restricted, with four memory arrays 200A to 200D corresponding to four memory banks. The memory arrays 200A to 200D respectively corresponding to the four memory banks 0 to 3 are provided with dynamic memory cells allocated like a matrix. According to the figure, the selection terminals of the memory cells allocated in the same column are coupled with the word lines (not illustrated) of each column, while the input/output terminals of the memory cells allocated in the same row are coupled with the complementary data lines (not illustrated) of each row.

In regard to the word lines (not illustrated) of the memory array 200A, only one word line is driven to the selection level depending on the result of decoding of the row address signal by a row decoder (Row DEC). The complementary data lines (not illustrated) of the memory array 200A are coupled with the I/O lines of a sense amplifier (Sense AMP) 202A and a column selection circuit (Column DEC) 203A. The sense amplifier 202A is an amplifying circuit for detecting and amplifying a fine potential difference appearing on the complementary data lines due to the data read operation from the memory cells. The column selection circuit 203A in this amplifying circuit includes a switch circuit for individually selecting the complementary data lines and then connecting these lines to the complementary I/O lines. A column switch circuit is selectively operated depending on the result of decoding of the column address signal by the column decoder 203A.

The memory arrays 200B to 200D are also provided with row decoders 201B to 201D, sense amplifiers 202B to 202D and column selection circuits 203B to 203D. The complementary I/O lines are used in common for each memory bank and are connected to the output terminal of a data input circuit (Din Buffer), including a write buffer 210, and the input terminal of a data output circuit (Dout Buffer) 211, including a main amplifier. A terminal DQ is defined, although the invention is not particularly so restricted, as a data input/output terminal for inputting or outputting the data D0 to D15 of 16 bits. A DQS buffer 215 generates a data strobe signal of the data outputted from the terminal DQ.

The address signals A0 to A14, which are supplied from the address input terminal, are once stored in an address buffer 204. The row-system address signal, among the above address signals inputted on the time series basis, is stored in a row address buffer 205. The column-system address signal is stored in a column address buffer 206. A refresh counter 208 generates the row address for the automatic refresh and self refresh modes.

A mode register 213 stores operation mode information. In regard to the row decoders 201A to 201D, only the row decoder corresponding to the bank designated with a bank select circuit 212 operates to realize selective operation of the word lines. With supply of the external control signals, such as clock signals CLK, /CLK (slash (/) indicates row enable signal), clock enable signal CKE, chip select signal /CS, column address strobe signal /CAS, row address strobe signal /RAS and write enable signal /WE and the address signals via the /DM, DQS and mode register 213, a control circuit 209 generates an internal timing signal for controlling the operation mode of the DDR SDRAM, the test mode and the operation of the circuit blocks, based on the level change and timing of the signals listed above. Moreover, this control circuit 209 is provided with input buffers corresponding to these signals.

The clock signals CLK and /CLK are inputted to the DLL circuit 214 through the clock buffer to generate an internal clock. The internal clock is used, although the invention is not particularly so restricted, as the input signal of the data output circuit 211 and DQS buffer 215. In addition, the clock signals inputted through the clock buffer are supplied to the clock terminals for application to the data input circuit 210 and column address counter 207.

The other external input signal is validated in synchronization with the rising edge of the relevant internal clock signal. The chip select signal /CS instructs a start of command input cycle with its low level. When the chip select signal /CS is at the high level (chip non-selecting condition), this signal and the other signals do not have any meaning. However, the selecting condition of the memory bank and the internal operation, such as a burst operation, are never influenced by the shift to the non-selecting condition. The signals /RAS, /CAS and /WE have functions which are different from that of the corresponding signals in the ordinary DRAM, and they are area validated in order to define the command cycle to be described later.

The clock enable signal CKE is used to instruct validity of the next clock signal. When the relevant signal CKE is at the high level, the rising edge of the next clock signal CLK is validated, but when the signal CKE is at the low level, the rising edge is invalidated. When the external control signal /OE for controlling the output enable mode to the data output circuit 211 is provided in the read mode, this signal /OE is also supplied to the control circuit 209. When the signal /OE is at the high level, for example, the data output circuit 211 is set to the high output impedance condition.

The read operation of the DDR SDRAM is executed as follows. Each chip select signal /CS, /RAS, /CAS and the write enable signal /WE is respectively inputted in synchronization with the clock CLK signal. The row address and bank selection signal are inputted simultaneously when the signal /RAS is set to 0, and they are held with the row address buffer 205 and bank select circuit 212. The row decoder 210, which is designated with the bank select circuit 212, decodes the row address signal so as to output the data of total rows as a minute signal from the memory cell array 200. The outputted minute signal is amplified and stored using the sense amplifier 202. The designated bank becomes active.

After three clocks from input of the row address, the column address and bank selection signal are inputted simultaneously when the signal CAS is set to 0, and the respective signals are held using the column address buffer 206 and bank select circuit 212. When the designated bank is active, the column address being held is outputted from the column address counter 207, and the column decoder 203 selects the column. The selected data is outputted from the sense amplifier 202. In this case, two sets of data (8 bits in the ×4 bits structure, 32 bits in the ×16 bits structure) are outputted.

The data outputted from the sense amplifier 202 is then outputted to the outside of the chip from the data output circuit 211. The output timing is synchronized with both rising and falling edges of the clock QCLK outputted from the DLL 214. In this case, two sets of data are converted to serial data from parallel data, as described above, and become the data of the structure (one set of data ×2). The data strobe signal DQS is outputted from the DQS buffer 215 simultaneously with data output. When the burst length stored in the mode register 213 is 4 or longer, the column address counter 207 is automatically incremented to read the next column data.

The DLL 214 operates to generate the operation clock QCLK of the data output circuit 211 and DQS buffer 215. Both the data output circuit 211 and the DQS buffer 215 take a certain period of time until the data signal and data strobe signal are actually outputted from the input of the internal clock, signal QCLK generated by the DLL 214. Therefore, the phases of the data signal and data strobe signal are matched with the external clock CLK by giving a lead to the phase of the internal clock signal QCLK relative to the external CLK using the replica circuit. Accordingly, the data signal and data strobe signal can be matched in phase with the external clock signal.

In this embodiment, a DDR SDRAM, which can assure the higher response characteristic and high speed operation, can be achieved because of use of the DLL circuit, which can be operated in a wider operation frequency range within a short synchronization time and can also obtain a synchronization signal that is stabilized for frequencies up to a higher frequency band.

Figure 17:
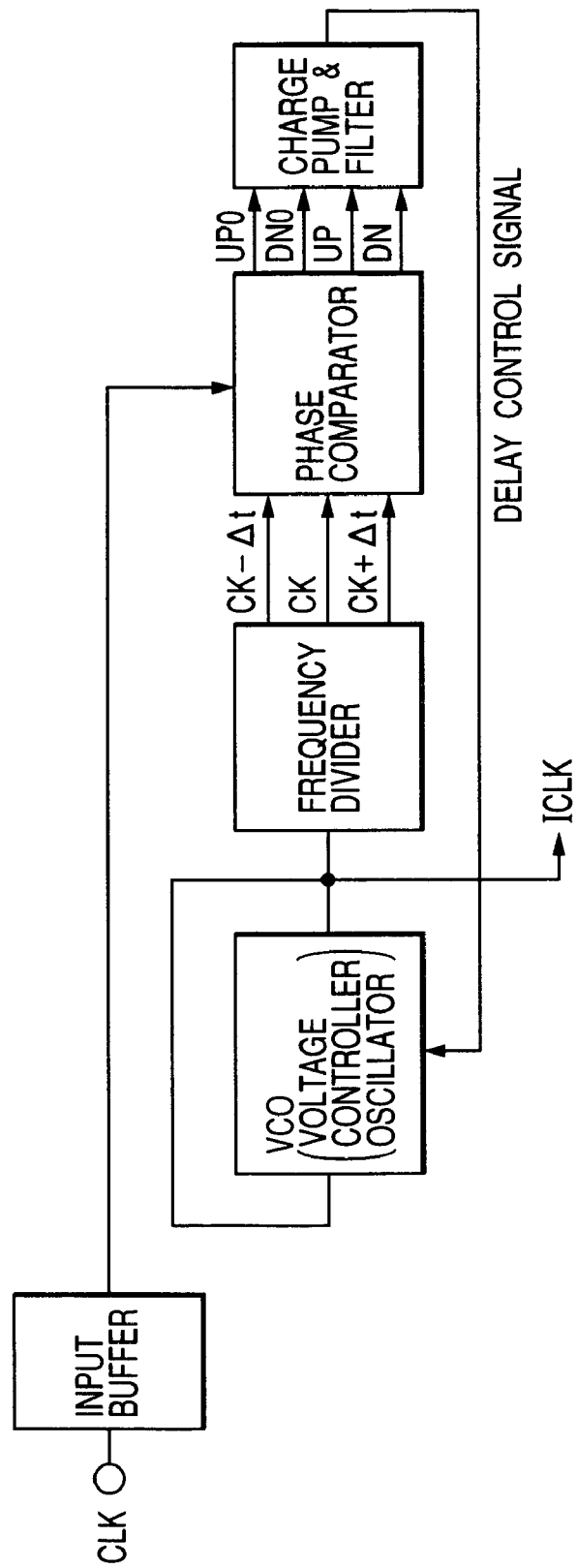
FIG. 17 is a block diagram illustrating an embodiment of the PLL circuit utilizing the synchronization circuit of the present invention.

FIG. 17 is a block diagram illustrating an embodiment of the PLL circuit utilizing the synchronization circuit of the present invention. A ring oscillator is formed by using an odd number of stages of the variable delay circuit and then feeding back an output signal of such variable delay circuit to the input thereof, and this ring oscillator is used as a voltage controlled oscillation circuit VCO. An output signal of this VCO is divided in frequency by a frequency dividing circuit to form the frequency-divided output CK and the signals CK−Δt and CK+Δt, which are different from the signal CK only in the phase of Δt. These frequency divided signals are then supplied to the phase comparator, which has been described with reference to FIG. 6 for phase comparison with the clock signal CLK supplied from the external circuit. Thereby, the signals UP0/DN0 for coarse adjustment and the signals UP/DN for fine adjustment are formed. These signals are then supplied to the charge pump & filter to form the delay control signal which is used to control the variable delay stages forming the VCO.

For example, the signals CK−Δt, CK and CK+Δt give a delay as much as Δt to the frequency-divided output CK' through a couple of delay circuits. Accordingly, it is sufficient when CK' is used as CK−Δt, CK'+Δt is used as CK and CK'+2Δt is used as CK+Δt. Otherwise, the pulse formed during the frequency dividing process in the frequency divider may also be used. Namely, it is also possible to use three signals which are deviated in phase in every half-period from the input pulse illustrated in FIG. 14 by utilizing the frequency divider/distributor illustrated in FIG. 13.

Owing to the structure described above, the VCO can generate an internal clock signal ICLK which is synchronized with the external clock CLK and is multiplied corresponding to the frequency dividing ratio in the frequency divider. When the VCO generates an internal pulse of equal frequency to the external clock CLK, the frequency divider described above may be eliminated. In this case, as the signals CK−Δt and CK+Δt, the signals of the one preceding stage and one subsequent stage of the unit delay stage forming the signal CK can be used.

Under the condition that the variable delay circuit 1 forms a control signal to be synchronized with the external clock, as in the case of FIG. 1, and this control signal is used as the control signal of the variable delay circuit forming the VCO, an internal clock with a frequency two times that of the external clock can be formed by equally setting the delay time of the unit delay stages and then reducing the number of stages of the variable delay stages of the VCO to the (½)-stage of the variable delay circuit 1, and an internal clock signal having a frequency four times that of the external clock can be formed by reducing the number of stages to (¼)-stage of the variable delay stages.

The present invention has been described practically on the basis of certain preferred embodiments thereof, but the present invention is never restricted only to the embodiments described above, and it allows, of course, various changes and modifications without departure from the basic concepts thereof. For example, various embodiments can be introduced for the phase comparator, the circuit to form the delay signals DL−1 and DL+1 for specifying the coarse adjustment range and minute range to the standard delay signal DL, and the circuit to realize phase comparison with such delay signals. The DLL circuit described above can also be adapted to a synchronous SRAM and various semiconductor integrated circuit devices to form a signal synchronized with the clock supplied from the external circuit, in addition to the DDR SDRAM described above. As described, the present invention may be widely used to provide a synchronization circuit and synchronization method.

The typical aspects and features of the present invention can provide the following effects. Both a good response characteristic and good stability can be attained, through use of a simplified structure, by generating a first pulse to be synchronized with a reference pulse, a second pulse which is leading in the phase for a certain period relative to the first pulse and a third pulse which is delayed in phase by a certain period from the first pulse using a first variable delay circuit; comparing the reference pulse with the first pulse using a first phase comparing circuit; comparing the reference pulse with the second pulse and third pulse using a second phase comparing circuit; forming a control voltage using a control voltage generating circuit which receives the comparison output of the first phase comparing circuit and the comparison output of the second phase comparing circuit and giving priority to the comparison output of the second comparing circuit relative to the comparison output of the first phase comparing circuit; and controlling the delay time of the first variable delay circuit by forming a control voltage by the comparison output of the first phase comparing circuit after the phases of the reference pulse and the second pulse or third pulse are matched by the second phase comparing circuit.

Moreover, a signal synchronized up to a higher frequency with higher accuracy can be obtained by dividing the frequency of the reference pulse using the frequency dividing circuit; forming the first pulse to be synchronized with this frequency-divided pulse in the first variable delay circuit; comparing the frequency-divided pulse with the first pulse using the first phase comparing circuit; dividing the frequency of the reference pulse in the equal diving ratio of the above-mentioned frequency-dividing circuit; forming multiphase clocks corresponding to such frequency dividing ratio using the frequency dividing/distributing circuit; giving a delay to the multiphase clocks by means of a second variable delay circuit, which is formed of the frequency dividing/distributing circuit having an identical structure to the first variable delay circuit; forming a control voltage of the first and second variable delay circuits using the control voltage generating circuit which receives the comparison output of the first phase comparing circuit; and generating a pulse corresponding to the reference pulse by referring a plurality of delay outputs of the second variable delay circuit to the waveform shaping circuit.

What is claimed is:
1. A synchronization circuit, comprising:
a reference pulse signal line to receive a reference pulse signal;
a frequency dividing circuit to divide a frequency of the reference pulse signal according to a predetermined frequency dividing ratio, to output a frequency-divided reference pulse signal;

a first variable delay circuit to generate a first pulse signal to be synchronized with the frequency-divided reference pulse signal outputted from the frequency dividing circuit;

a first phase comparing circuit to compare the frequency-divided reference pulse signal with the first pulse signal;

a frequency dividing/distributing circuit to divide the frequency of the reference pulse signal and to generate multiphase clocks according to the predetermined frequency dividing ratio;

a second variable delay circuit which is configured to have a substantially identical structure to that of the first variable delay circuit, and which includes a plurality of stages to respectively delay the multiphase clocks outputted from the frequency dividing/distributing circuit;

a waveform combining circuit to generate a second pulse signal corresponding to the reference pulse signal in response to receipt of a delayed output from the plurality of stages in the second variable delay circuit; and a control voltage generating circuit to generate control voltages to control the first variable delay circuit and the second variable delay circuit in response to receipt of a comparison output of the first phase comparing circuit, wherein a frequency of the first pulse signal and a frequency of the multiphase clocks are divided into a lower frequency than that of the reference pulse signal so as to prevent deformation or disappearance of outputs of the first variable delay circuit and the second variable delay circuit.

2. A synchronization circuit according to claim 1, comprising:

an input buffer which provides the reference pulse signal to the first and second variable delay circuits;

an external terminal;

an output buffer coupled between the second variable delay circuit and the external terminal, to route an output pulse generated from the second variable delay circuit to the external terminal; and a replica circuit having a delay time equivalent to that of the input buffer and the output buffer, and coupled between the input buffer and the first variable delay circuit.

3. A synchronization circuit according to claim 1, wherein the first and the second variable delay circuits comprise a plurality of stages including unit variable delay circuits, and wherein a number of the unit variable delay circuits are arranged so as to correspond to the predetermined frequency dividing ratio.

4. A synchronization circuit according to claim 1, wherein the second pulse is converted to the pulse of the frequency which is identical to that of the reference pulse signal inputted on the reference pulse signal line.

5. A synchronization circuit according to claim 1, wherein the synchronization circuit is a delay locked-loop (DLL) or a phase locked-loop (PLL) circuit.

6. An integrated circuit (IC) comprising:

at least input buffer and/or output buffer; and a synchronization circuit, including:

a reference pulse signal line to receive a reference pulse signal;

a frequency dividing circuit to divide a frequency of the reference pulse signal according to a predetermined frequency dividing ratio, to output a frequency-divided reference pulse signal;

a first variable delay circuit to generate a first pulse signal to be synchronized with the frequency-divided reference pulse signal outputted from the frequency dividing circuit;

a first phase comparing circuit to compare the frequency-divided reference pulse signal with the first pulse signal;

a frequency dividing/distributing circuit to divide the frequency of the reference pulse signal and to generate multiphase clocks according to the predetermined frequency dividing ratio;

a second variable delay circuit which is configured to have a substantially identical structure to that of the first variable delay circuit, and which includes a plurality of stages to respectively delay the multiphase clocks outputted from the frequency dividing/distributing circuit;

a waveform combining circuit to generate a second pulse signal corresponding to the reference pulse signal in response to receipt of a delayed output from the plurality of stages in the second variable delay circuit; and a control voltage generating circuit to generate control voltages to control the first variable delay circuit and the second variable delay circuit in response to receipt of a comparison output of the first phase comparing circuit, wherein a frequency of the first pulse signal and a frequency of the multiphase clocks are divided into a lower frequency than that of the reference pulse signal so as to prevent deformation or disappearance of outputs of the first variable delay circuit and the second variable delay circuit.

7. An IC according to claim 6, comprising:

a reference pulse input buffer which provides the reference pulse signal to the first and second variable delay circuits;

a synchronization circuit output terminal;

a synchronization circuit output buffer coupled between the second variable delay circuit and the synchronization circuit output terminal, to route an output pulse generated from the second variable delay circuit to the synchronization circuit output terminal; and a replica circuit having a delay time equivalent to that of the reference pulse input buffer and the synchronization circuit output buffer, and coupled between the reference pulse input buffer and the first variable delay circuit.

8. An IC according to claim 6, wherein the first and the second variable delay circuits comprise a plurality of stages including unit variable delay circuits, and wherein a number of the unit variable delay circuits are arranged so as to correspond to the predetermined frequency dividing ratio.

9. An IC according to claim 6, wherein the second pulse is converted to the pulse of the frequency which is identical to that of the reference pulse signal inputted on the reference pulse signal line.

10. An IC according to claim 6, wherein the synchronization circuit is a delay locked-loop (DLL) or a phase locked-loop (PLL) circuit.

11. A system comprising:

at least input buffer and/or output buffer; and a synchronization circuit, including:

a reference pulse signal line to receive a reference pulse signal;

a frequency dividing circuit to divide a frequency of the reference pulse signal according to a predetermined frequency dividing ratio, to output a frequency-divided reference pulse signal;

a first variable delay circuit to generate a first pulse signal to be synchronized with the frequency-divided reference pulse signal outputted from the frequency dividing circuit;

a first phase comparing circuit to compare the frequency-divided reference pulse signal with the first pulse signal;

a frequency dividing/distributing circuit to divide the frequency of the reference pulse signal and to generate multiphase clocks according to the predetermined frequency dividing ratio;

a second variable delay circuit which is configured to have a substantially identical structure to that of the first variable delay circuit, and which includes a plurality of stages to respectively delay the multiphase clocks outputted from the frequency dividing/distributing circuit;

a waveform combining circuit to generate a second pulse signal corresponding to the reference pulse signal in response to receipt of a delayed output from the plurality of stages in the second variable delay circuit; and a control voltage generating circuit to generate control voltages to control the first variable delay circuit and the second variable delay circuit in response to receipt of a comparison output of the first phase comparing circuit, wherein a frequency of the first pulse signal and a frequency of the multiphase clocks are divided into a lower frequency than that of the reference pulse signal so as to prevent deformation or disappearance of outputs of the first variable delay circuit and the second variable delay circuit.

12. A system according to claim 11, comprising:

a reference pulse input buffer which provides the reference pulse signal to the first and second variable delay circuits;

a synchronization circuit output terminal;

a synchronization circuit output buffer coupled between the second variable delay circuit and the synchronization circuit output terminal, to route an output pulse generated from the second variable delay circuit to the synchronization circuit output terminal; and a replica circuit having a delay time equivalent to that of the reference pulse input buffer and the synchronization circuit output buffer, and coupled between the reference pulse input buffer and the first variable delay circuit.

13. A system according to claim 11, wherein the first and the second variable delay circuits comprise a plurality of stages including unit variable delay circuits, and wherein a number of the unit variable delay circuits are arranged so as to correspond to the predetermined frequency dividing ratio.

14. A system according to claim 11, wherein the second pulse is converted to the pulse of the frequency which is identical to that of the reference pulse signal inputted on the reference pulse signal line.

15. A system according to claim 11, wherein the synchronization circuit is a delay locked-loop (DLL) or a phase locked-loop (PLL) circuit.

* * * * *